United States Patent
Chen et al.

(10) Patent No.: US 7,952,786 B2
(45) Date of Patent: May 31, 2011

(54) METHOD OF OPERATING A MICROMECHANICAL DEVICE THAT CONTAINS ANTI-STICTION GAS-PHASE LUBRICANT

(75) Inventors: Dongmin Chen, Saratoga, CA (US); Fulin Xiong, San Jose, CA (US)

(73) Assignee: Miradia Inc., Santa Clara, CA (US)

( * ) Notice: Subject to any disclaimer, the term of this patent is extended or adjusted under 35 U.S.C. 154(b) by 501 days.

(21) Appl. No.: 12/108,030

(22) Filed: Apr. 23, 2008

(65) Prior Publication Data

US 2009/0284823 A1 Nov. 19, 2009

Related U.S. Application Data

(60) Division of application No. 11/389,423, filed on Mar. 24, 2006, now Pat. No. 7,372,615, which is a continuation of application No. 11/315,920, filed on Dec. 22, 2005, now Pat. No. 7,471,439.

(60) Provisional application No. 60/738,730, filed on Nov. 23, 2005.

(51) Int. Cl.
*G02B 26/00* (2006.01)
*G02B 26/08* (2006.01)
*G02F 1/29* (2006.01)

(52) U.S. Cl. ........................ 359/290; 359/298

(58) Field of Classification Search .......... 359/290–292, 359/295, 298
See application file for complete search history.

(56) References Cited

U.S. PATENT DOCUMENTS

| 4,916,957 A | 4/1990 | Quermann |
| 5,331,454 A | 7/1994 | Hornbeck |
| 5,364,547 A | 11/1994 | Babb et al. |
| 5,412,186 A | 5/1995 | Gale |
| 5,429,708 A | 7/1995 | Linford et al. |
| 5,447,600 A | 9/1995 | Webb |
| 5,482,564 A | 1/1996 | Douglas et al. |
| 5,512,374 A | 4/1996 | Wallace et al. |
| 5,523,878 A | 6/1996 | Wallace et al. |
| 5,576,878 A | 11/1996 | Henck |

(Continued)

OTHER PUBLICATIONS

Almanza-Workman, A. Marcia et al., "Water Dispersible Silanes for Wettability Modification of Polysilicon for Stiction Reduction in Silicon Based Micro-electromechanical Structures", J. Electrochem. Soc., 149 (1), H6-H11 (2002).

(Continued)

*Primary Examiner* — Ricky L Mack
*Assistant Examiner* — Brandi N Thomas
(74) *Attorney, Agent, or Firm* — Patterson & Sheridan, LLP

(57) ABSTRACT

One embodiment of an micromechanical device includes a first contact surface, a moveable component having a second contact surface, and a coating of liquid or solid lubricant on at least one of the contact surfaces, where the second contact surface interacts with the first contact surface during device operation, and a gas-phase lubricant is disposed between the first contact surface and the second contact surface, where the gas-phase lubricant is adapted to increase the usable lifetime of the liquid or solid lubricant coating on the contact surfaces. One advantage of the disclosed device is that a gas-phase lubricant has a high diffusion rate and, therefore, is self-replenishing, meaning that it can quickly move back into a contact region after being physically displaced from the region by the contacting surfaces of the device during operation. Consequently, the gas-phase lubricant used with conventional solid or liquid lubricants is more reliable than solid or liquid lubricants used alone in preventing stiction-related device failures.

6 Claims, 20 Drawing Sheets

U.S. PATENT DOCUMENTS

| | | | |
|---|---|---|---|
| 5,602,671 A | 2/1997 | Hornbeck | |
| 5,610,438 A | 3/1997 | Wallace et al. | |
| 5,694,740 A | 12/1997 | Martin et al. | |
| 5,771,116 A | 6/1998 | Miller et al. | |
| 5,936,758 A | 8/1999 | Fisher et al. | |
| 5,939,785 A | 8/1999 | Klonis et al. | |
| 5,961,732 A | 10/1999 | Patrin et al. | |
| 6,004,912 A | 12/1999 | Gudeman | |
| 6,024,801 A | 2/2000 | Wallace et al. | |
| 6,036,786 A | 3/2000 | Becker et al. | |
| 6,300,294 B1 | 10/2001 | Robbins et al. | |
| 6,365,229 B1 | 4/2002 | Robbins | |
| 6,475,570 B2 | 11/2002 | Jacobs | |
| 6,618,520 B2 | 9/2003 | Tew | |
| 6,674,140 B2 | 1/2004 | Martin | |
| 6,704,131 B2 | 3/2004 | Liu | |
| 6,709,948 B2 | 3/2004 | Dewa et al. | |
| 6,733,683 B2 | 5/2004 | Dewa | |
| 6,746,886 B2 * | 6/2004 | Duncan et al. | 438/27 |
| 6,764,875 B2 | 7/2004 | Shook | |
| 6,806,993 B1 | 10/2004 | Adams et al. | |
| 6,841,079 B2 | 1/2005 | Elsbernd et al. | |
| 6,843,936 B1 | 1/2005 | Jacobs | |
| 6,891,657 B2 | 5/2005 | Hewlett et al. | |
| 6,902,947 B2 * | 6/2005 | Chinn et al. | 438/48 |
| 6,921,680 B2 | 7/2005 | Robbins | |
| 6,930,367 B2 | 8/2005 | Lutz et al. | |
| 6,960,305 B2 | 11/2005 | Doan et al. | |
| 7,068,417 B2 | 6/2006 | Yang | |
| 7,141,870 B2 | 11/2006 | Yang | |
| 7,303,645 B2 | 12/2007 | Yang et al. | |
| 7,344,956 B2 | 3/2008 | Yang et al. | |
| 2003/0002019 A1 | 1/2003 | Miller | |
| 2004/0136044 A1 | 7/2004 | Miller et al. | |
| 2004/0145795 A1 | 7/2004 | Pan et al. | |
| 2004/0145822 A1 | 7/2004 | Pan et al. | |
| 2004/0159631 A1 | 8/2004 | Pan et al. | |
| 2004/0169190 A1 | 9/2004 | Ueno et al. | |
| 2004/0240033 A1 | 12/2004 | Pan et al. | |
| 2005/0104144 A1 | 5/2005 | Yang et al. | |
| 2005/0157375 A1 | 7/2005 | Doan et al. | |
| 2005/0174628 A1 | 8/2005 | Kelly et al. | |

OTHER PUBLICATIONS

Chen, Dongmin, "Vapor Phase Anti-Stiction for MEMS and NMES Devices" A GOALI Proposal submitted to Division of Civil and Mechanical Systems Solid Mechanics and Materials Engineering (SMME), pp. 1-18, Dec. 2003.

Kobrin, Boris, et al. "Molecular Vapor Deposition—An Improved Vapor-Phase Deposition Technique of Molecular Coatings for MEMS Devices", SEMI Technical Symposium: Innovations in Semiconductor Manufacturing (STS:ISM), SEMICON West 2004, 4 pages.

* cited by examiner

METHOD OF OPERATING A MICROMECHANICAL DEVICE THAT CONTAINS ANTI-STICTION GAS-PHASE LUBRICANT

CROSS-REFERENCE TO RELATED APPLICATIONS

This application is a divisional of U.S. patent application Ser. No. 11/389,423, filed Mar. 24, 2006, which is a continuation of U.S. patent application Ser. No. 11/315,920, filed Dec. 22, 2005, which claims the benefit of U.S. Provisional Patent Application Ser. No. 60/738,730, filed Nov. 23, 2005, all of which are herein incorporated by reference.

BACKGROUND OF THE INVENTION

1. Field of the Invention

Embodiments of the present invention relate generally to micro-electro-mechanical and nano-electro-mechanical systems and more specifically to an anti-stiction gas-phase lubricant for such systems.

2. Description of the Related Art

As is well-known, atomic level and microscopic level forces between device components become far more critical as devices become smaller. Micromechanical devices, such as Micro-electro-mechanical systems (MEMS) and nano-electro-mechanical systems (NEMS) is area where problems related to these types of forces are quite prevalent. In particular, "stiction" forces created between moving parts that come into contact with one another, either intentionally or accidentally, during operation are a common problem with micromechanical devices. Stiction-type failures occur when the interfacial attraction forces created between moving parts that come into contact with one another exceed restoring forces. As a result, the surfaces of these parts either permanently or temporarily adhere to each other, causing device failure or malfunction. Stiction forces are complex surface phenomena that generally include capillary forces, Van der Waal's forces and electrostatic attraction forces. As used herein, the term "contact" refers generally to any interaction between two surfaces and is not limited to the actual physical touching of the surfaces. Some examples of typical micromechanical devices are RF switches, optical modulators, microgears, accelerometers, worm gears, transducers, fluid nozzles, gyroscopes, and other similar devices or actuators.

The stiction issue is especially problematic in devices such as the RF switch, optical modulator, microgears, and other actuators. Various elements in these devices often interact with each other during operation at frequencies between a few hertz (Hz) and about a few gigahertz (GHz). Various analyses have shown that, without adding some form of lubrication to these types of devices to reduce stiction between component surfaces, product lifetimes may range from only a few contacts to a few thousand contacts, which is generally well below a commercially viable lifetime. Consequently, one of the biggest challenges facing the MEMS and NEMS industries is the long-term reliability of contacting microstructures in the face of stiction.

Several techniques to address the stiction between two contacting surfaces have been discussed in the various publications. These techniques include texturing the surfaces (e.g., micro patterning or laser patterning) to reduce the overall adhesion force by reducing the effective contact area, and selecting specific materials from which the contacting surfaces are made to lower the surface energy, reduce charging, or contact potential difference between components.

Moreover, some prior references have suggested the insertion of a "lubricant" into the region around the interacting devices to reduce the chance of stiction-type failures. Such a lubricant often times is in a solid or liquid state, depending on the properties of the material, and the temperature and pressure or environment in which the lubricant is placed. In general, the terms a "solid" lubricant or a "liquid" lubricant is a lubricant that is in a solid or liquid state under ambient conditions, which is typically defined as room temperate and atmospheric pressure. Some prior art references describe a lubricant as being in a "vapor" state. These references use of the term vapor phase lubricant to generally describe a mixture of components that contain a carrier gas (e.g., nitrogen) and a vaporized second component that is a solid or liquid at temperatures and pressures near ambient conditions (e.g., STP). In most conventional applications the solid or liquid lubricant will remain in a solid or liquid state at temperatures much higher than room temperature and pressures much lower than atmospheric pressure conditions.

Another common approach to combat stiction between interacting components is to coat the various interacting components with a low-surface energy organic passivation layer, such as the self-assembled monolayer (SAM). The low-surface energy organic passivation layer coating results in a hydrophobic surface that is used to reduce or eliminate capillary forces, molecular bonding forces, and reduce electrostatic attraction forces in some cases. The material(s) used to form a SAM layers are typically liquids under ambient conditions. Self-assembled-monolayer coatings are commonly applied to MEMS type devices by immersion of the device in a liquid containing the components used to form the SAM molecules. In some cases low-surface energy organic passivation layer, such as a SAM coating, can be formed by exposing the surface of the device to a vapor containing a carrier gas that has SAM layer forming components entrained in it typically by bubbling the carrier gas through a vessel containing heated SAM layer forming components. The process of forming the low-surface energy organic passivation layer is commonly referred to in the art as "vapor lubricant."

Typically, the low-surface energy organic passivation layer, such as SAM coatings, are only one monolayer thick, although coatings that are a few monolayers have also been reported. Generally, these types of coatings have a very limited usable lifetime, since they are easily damaged or displaced due to impact or wear created by the interaction of the various moving components. Without some way to reliably restore or repair the damaged coatings, stiction inevitably returns, and device failure results. Another approach is to introduce liquid-type lubricants within the MEMS or NEMS package in an effort to coat contacting surfaces and reduce stiction. However, these lubricants typically diffuse away from or are physically displaced during normal device operation and oftentimes diffuse too slowly to reliably cover the exposed regions to reliably prevent stiction failures. Another common problem is that liquid lubricants tend to break down during device operation to the point where they no longer provide proper lubrication. Therefore, liquid lubricants must be continually replenished during device operation. One method for providing lubrication to a MEMS device using a liquid lubricant is to provide a reversibly absorbing getter material within the package in which the MEMS device resides. This configuration is disclosed in U.S. Pat. No. 6,843, 936. This requirement introduces a host of problems related to providing reliable supplies of such lubricants. However, adding the reversibly absorbing getter, or reservoirs, to retain the liquid lubricants increases package size and packaging complexity and adds steps to the fabrication process, thus increasing piece-part cost as well as the overall manufacturing cost of MEMS or NEMS devices. Forming a device that uses these techniques will generally require a number of labor intensive and costly processing steps, such as mixing the getter material, applying the getter material to the device containing package, curing the getter material, conditioning or activating the getter material, and then sealing the MEMS device and the getter within the sealed package.

Another common approach to combat stiction between interacting components is to use a nebulization process that uses a liquid lubrication system that creates a lubricant "fog," or lubricant "mist," that lubricates the surfaces of the MEMS device by exposing the interacting surfaces to tiny droplets of the liquid lubricant that is suspended in a carrier gas. One such process is described in column 3, line 28 of U.S. Pat. No. 6,921,680, where it notes that "it is critical that the nebulizer system be maintained in a homogenous cloud of the lubricant around the device specimen." These types of systems require additional steps to keep the concentration of the liquid droplets within the lubricant "fog" homogeneous which can be complex and costly. The use of the lubricant "fog" will also require additional processing time to lubricate the devices to ensure that the "mist" reaches all parts of a device to form a suitable lubrication layer.

Examples of typical lubricants that are solid or liquid at ambient conditions and temperatures well above ambient temperature can be found in reference such as U.S. Pat. No. 6,930,367. Such prior art lubricants include dichlordimethylsilane ("DDMS"), octadecyltrichlorsilane ("OTS"), perfluoroctyltrichlorsilane ("PFOTCS"), perfluorodecanoic acid ("PFDA"), perfluorodecyl-trichlorosilane ("FDTS"), perfluoro polyether ("PFPE") and/or fluoroalkylsilane ("FOTS") that are deposited on various interacting components by use of a vapor deposition process, such as atmospheric chemical vapor deposition (APCVD), low pressure chemical vapor deposition (LPCVD), plasma enhanced chemical vapor deposition (PECVD), or other similar deposition processes.

As the foregoing illustrates, what is needed in the art a more reliable and cost-effective approach to providing anti-stiction lubrication to MEMS and NEMS.

SUMMARY OF THE INVENTION

One embodiment of the invention sets forth a method of operating a micromechanical device comprising biasing one or more electrodes, wherein biasing the one or more electrodes causes a moveable component having a first contact surface to interact with a second contact surface, biasing the one or more electrodes repeatedly until a stiction force prevents the first contact surface from being separated from the second contact surface, and separating the first contact surface from the second contact surface by exposing the first and second contact surfaces to a gas-phase lubricant.

Embodiments of the invention may further provide a method of operating a micromechanical device comprising providing a micromechanical device that comprises a first contact surface, a moveable component having a second contact surface, wherein the second contact surface interacts with the first contact surface during device operation, and a liquid or solid lubricant material disposed on at least one of the first contact surface and the second contact surface, causing the second contact surface of the moveable component to interact repeatedly with the first contact surface, and disposing a gas-phase lubricant between the first contact surface and the second contact surface, wherein the gas-phase lubricant is adapted to increase the usable lifetime of the liquid or solid lubricant.

In another embodiment, a method is provided for operating a micromechanical device that includes a moveable component having a moving surface that interacts with a fixed surface of the micromechanical device, and a liquid or solid lubricant material is disposed on at least one of the moving surface and the fixed surface, the method comprising causing the moving surface to interact repeatedly with the first contact surface, and disposing a gas-phase lubricant between the moving surface and the fixed surface, wherein the gas-phase lubricant is adapted to increase the usable lifetime of the liquid or solid lubricant.

One advantage of the disclosed micromechanical device is that a gas-phase lubricant diffuses at a substantially higher rate than conventional solid or liquid lubricants. A higher diffusion rate enables a gas-phase lubricant to be self-replenishing, meaning that the gas-phase lubricant can quickly move back into a contact region after being physically displaced from the region by the contacting surfaces of the electro-mechanical device during operation. Consequently, the gas-phase lubricant more reliably prevents stiction-related device failures relative to conventional solid or liquid lubricants.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally relate to a device that has an improved usable lifetime due to the addition of a gas-phase lubricant that reduces the likelihood of stiction occurring between the various moving parts in an electromechanical device. In one example, aspects of this invention may be especially useful for fabricating and using micromechanical devices, such as MEMS devices, NEMS devices, or other similar thermal or fluidic devices. In general, a gas-phase lubricant is disposed around components of such devices that interact with one another during operation to reduce the chances of stiction-related failures. One of skill in the art will recognize that the term lubricant, as used herein, is intended to describe a material adapted to provide lubrication, anti-stiction, and/or anti-wear properties. As described in further detail herein, the term gas-phase lubricant as used herein is generally intended to describe a lubricant that is in a gaseous state at all times during the operation and storage of a device.

Figure 1A:
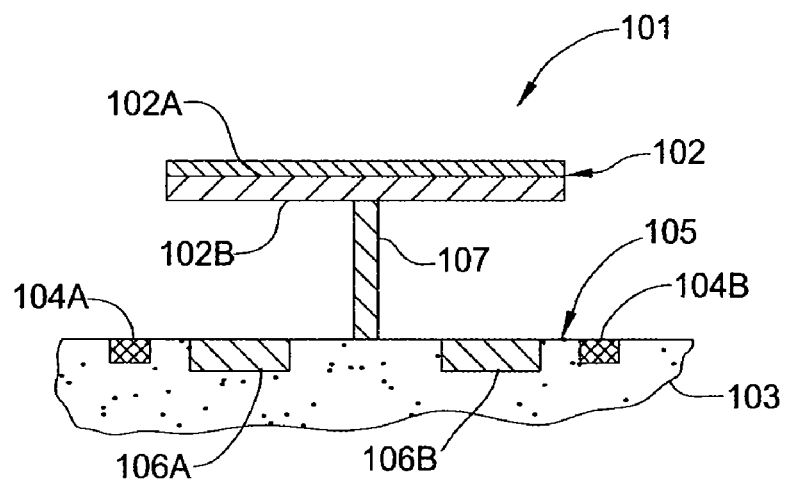
FIG. 1A schematically illustrates a cross-sectional view of a single mirror assembly 101 according to this invention.

FIG. 1A illustrates a representative micromechanical device that is used herein to describe various embodiments of the invention. The device shown in FIG. 1A is intended to schematically illustrate a cross-sectional view of a single MEMS device, such as a single mirror assembly 101 contained in a spatial light modulator (SLM). Typically, a MEMS device contains one or more moving parts that contacts or interacts with one or more surfaces found in the device during device operation. One should note that the MEMS device shown in FIG. 1A is not intended in any way to limit the scope of the invention described herein, since one skilled in the art would appreciate that the various embodiments described herein could be used in other MEMS, NEMS, larger scale actuators or sensors, or other comparable devices that experience stiction or other similarly related problems. While the discussion below specifically discusses the application of one or more of the various embodiments of the invention using a MEMS or NEMS type of device, these configurations are not intended to be limiting as to the scope of the invention.

In general, a single mirror assembly 101 may contain a mirror 102, base 103, and a flexible member 107 that connects the mirror 102 to the base 103. The base 103 is generally provided with at least one electrode (elements 106A or 106B) formed on a surface 105 of the base 103. The base 103 can be made of any suitable material that is generally mechanically stable and can be formed using typical semiconductor processing techniques. In one aspect, the base 103 is formed from a semiconductor material, such as a silicon containing material, and processed according to semiconductor processing techniques. Other materials may be used in alternative embodiments of the invention. The electrodes 106A, 106B can be made of any materials that conduct electricity. In one aspect, the electrodes 106A, 106B are made of a metal (e.g., aluminum, titanium) preferentially deposited on the surface 105 of the base 103. A MEMS device of this type is described in the commonly assigned U.S. patent application Ser. No. 10/901,706, filed Jul. 28, 2004.

The mirror 102 generally contains a reflective surface 102A and a mirror base 102B. The reflective surface 102A is generally formed by depositing a metal layer, such as aluminum or other suitable material, on the mirror base 102B. The mirror 102 is attached to the base 103 by a flexible member 107. In one aspect, the flexible member 107 is a cantilever spring that is adapted to bend in response to an applied force and to subsequently return to its original shape after removal of the applied force. In one embodiment, the base 103 is fabricated from a first single piece of material, and the flexible member 107 and the mirror base 102B are fabricated from a second single piece of material, such as single crystal silicon. The configuration set forth in FIG. 1A is not intended to limit the scope of the invention in any way. Thus, the use of any configuration that allows the surface of one component (e.g., mirror 102) to contact the surface of another component (e.g., base 103) during device operation generally falls within the scope of the invention. For example, a simple cantilever beam that pivots about a hinge in response to an applied force such that one end of the cantilever beam contacts another surface of the device is within the scope of the invention.

In one aspect, one or more optional landing pads (elements 104A and 104B in FIG. 1A) are formed on the surface 105 of the base 103. The landing pads are formed, for example, by depositing a metal layer containing aluminum, titanium nitride, tungsten or other suitable materials. In other configurations, the landing pads may be made of silicon (Si), polysilicon (poly-Si), silicon nitride (SiN), silicon carbide (SiC), copper (Cu), titanium (Ti) and/or other suitable materials.

Figure 1B:
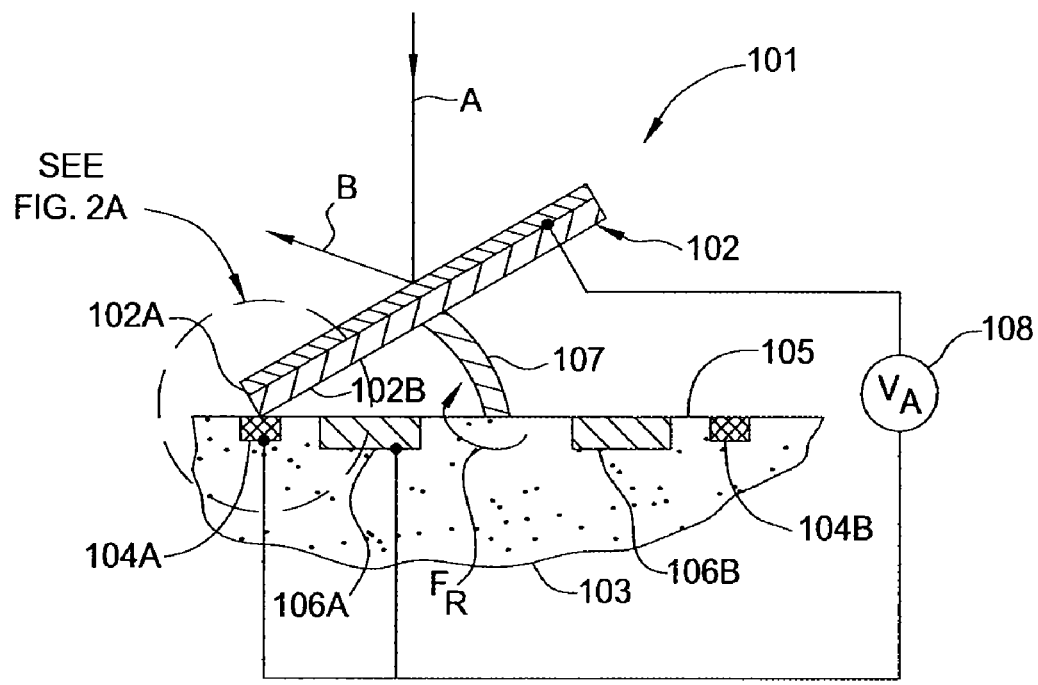
FIG. 1B schematically illustrates a cross-sectional view of a single mirror assembly 101 in a deflected state, according to one embodiment of the invention.

FIG. 1B illustrates the single mirror assembly 101 in a distorted state due to the application of an electrostatic force $F_E$ created by applying a voltage $V_A$ between the mirror 102 and the electrode 106A using a power supply 108. In one aspect, as shown in FIG. 1B, it may also be desirable to bias a landing pad (e.g., elements 104A) to the same potential as the electrode (e.g., element 106A). During typical operation, the single mirror assembly 101 is actuated such that the mirror 102 contacts the landing pad 104A to ensure that at a desired angle is achieved between the mirror 102 and the base 103 so that incoming light "A" is reflected off the surface of the mirror 102 in a desired direction "B." The deflection of the mirror 102 towards the electrode 106A due to the application of voltage $V_A$ creates a restoring force $F_R$ (e.g., moment), due to the bending of the flexible member 107. The magnitude of the restoring force $F_R$ is generally limited by the physical dimensions of the flexible member 107, the magnitude of distortion experienced by the flexible member 107 and the mechanical properties of the material from which the flexible member 107 is made. One should note that the maximum restoring force $F_R$ is typically no greater than the torque applied by the electrostatic force $F_E$ that can be generated by the application of the maximum voltage $V_A$. To assure contact between the mirror 102 and the landing pad 104A the electrostatic force $F_E$ must be greater than the maximum restoring force $F_R$.

Figure 2A:
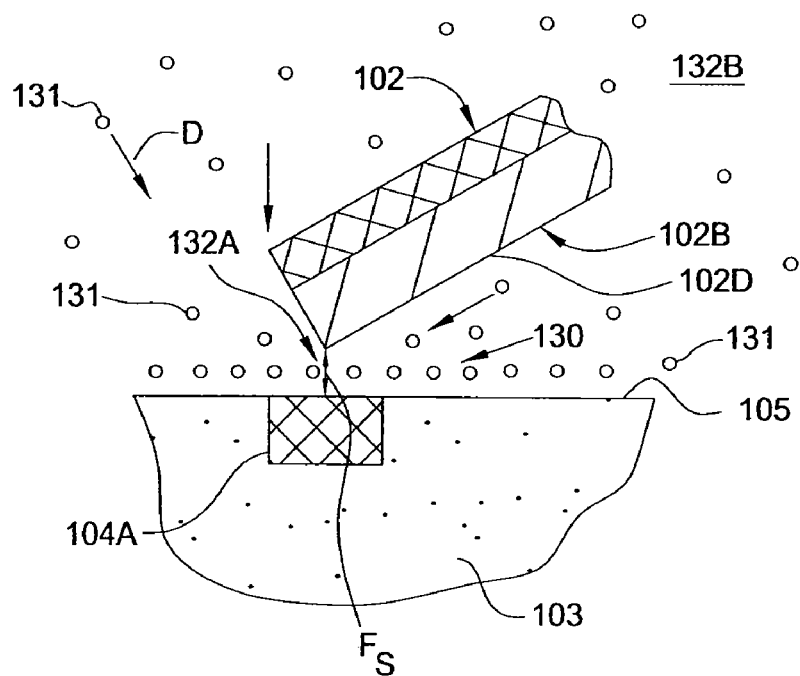
FIG. 2A illustrates a close-up cross-sectional view of a single mirror assembly 101, according to one embodiment of the invention.
Figure 2B:
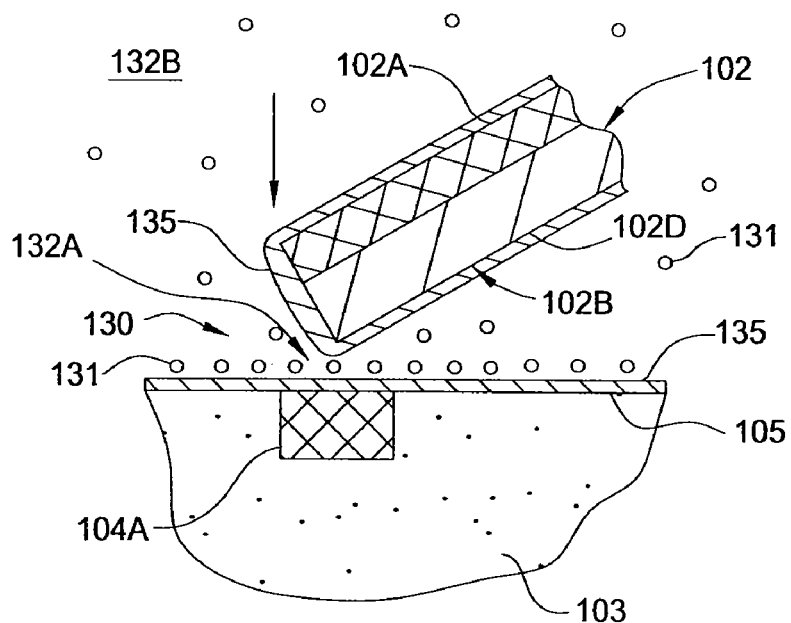
FIG. 2B illustrates a close-up cross-sectional view of a single mirror assembly 101, according to one embodiment of the invention.

FIGS. 2A-2B are close-up illustrations of a contact region 132A of the deflected single mirror assembly 101 and the landing pad 104A of FIG. 1B. A gas-phase lubricant, representatively illustrated as elements 131, is disposed in the contact region 132A, which is formed between the interacting components, and a region 132B, which surrounds the components of the single mirror assembly 101 that contact the landing pad 104A, such as mirror 102. Referring to FIG. 2A, as the distance between the mirror 102 and the landing pad 104A decreases, the interaction between the surfaces of these components generally creates one or more stiction forces $F_s$ that acts on the mirror 102. When the stiction forces $F_s$ equals or exceeds the restoring force $F_R$, device failure results, since the mirror 102 is prevented from moving to a different position when the electrostatic force generated by voltage $V_A$ is removed or reduced.

As previously described herein, stiction forces are complex surface phenomena that generally include three major components. The first is the so-called "capillary force" that is created at the interface between a liquid and a solid due to an intermolecular force imbalance at the surface of a liquid (e.g., Laplace pressure differences) that generates an adhesive-type attractive force. Capillary force interaction in MEMS and NEMS devices usually occurs when a thin layer of liquid is trapped between the surfaces of two contacting components. The second major component of stiction forces is the Van der Waal's force, which is a basic quantum mechanical intermolecular force that results when atoms or molecules come very close to one another. When device components contact one another, Van der Waal's forces arise from the polarization induced in the atoms of one component by the presence of the atoms of the second component. When working with very planar structures, such as those in MEMS and NEMS devices, these types of stiction forces can be significant due to the size of the effective contact area. The third major component of stiction forces is the electrostatic force created by the coulombic attraction between trapped charges found in the interacting components.

Figure 3A:
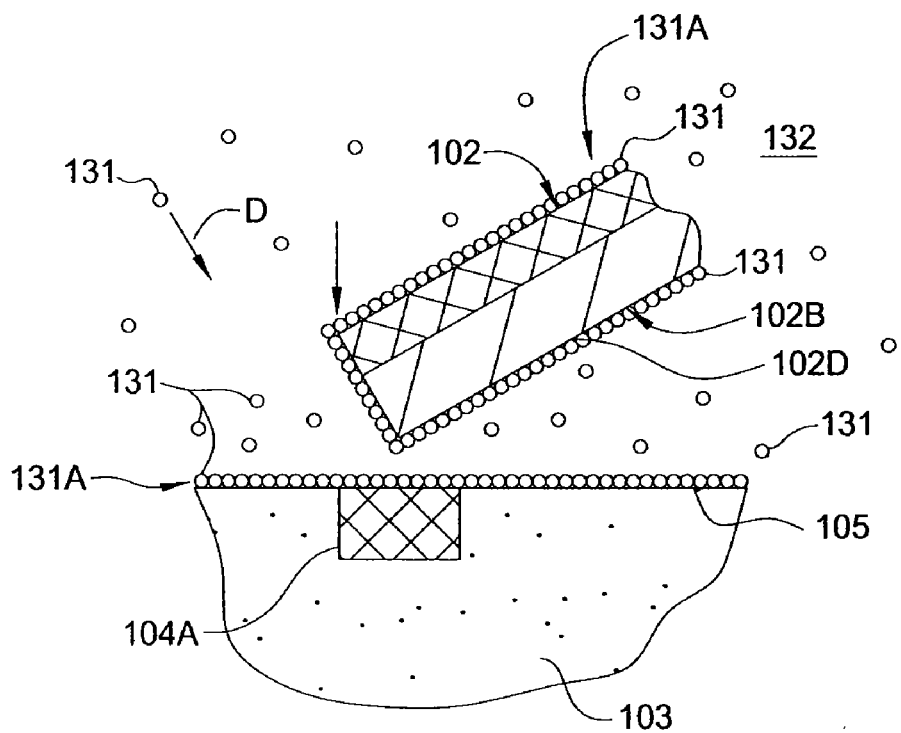
FIG. 3A illustrates a close-up cross-sectional view of a single mirror assembly 101, according to one embodiment of the invention.
Figure 3B:
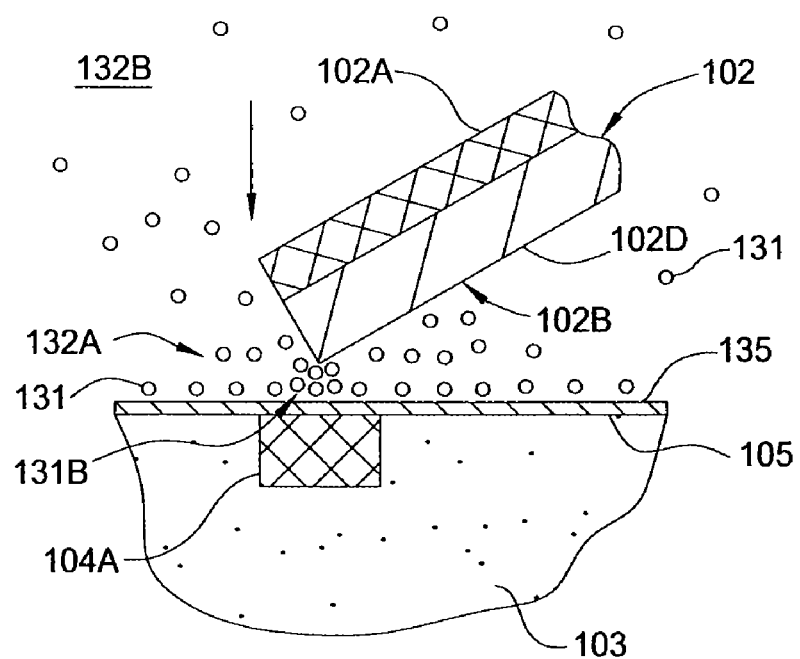
FIG. 3B illustrates a close-up cross-sectional view of a single mirror assembly 101, according to one embodiment of the invention.

Referring back now to FIG. 2A, a gas-phase lubricant 131 is disposed in the contact region 132A between the interacting surface of the mirror 102 and the landing pad 104A to reduce the stiction forces created between these two components during device operation. The gas-phase lubricant 131 preferably has an adequate sticking coefficient, or adsorption coefficient, in relation to the relevant component surfaces (here, the surfaces of the mirror 102, surface 105 and landing pad 104A) and therefore forms an adsorbed monolayer 131A (FIG. 3A) on the landing pad 104A. The monolayer 131A advantageously reduces the direct interaction between the mirror 102 and the landing pad 104A and, thus, decreases the likelihood of stiction-related failures. More specifically, it is believed that the monolayer 131A of gas-phase lubricant 131 impedes the generation of Van der Waal's forces between the atoms of the mirror 102 and the landing pad 104A and also reduces the coulombic attraction between the atoms of the mirror 102 and the landing pad 104A by reducing the potential differences between the surfaces of these two components. In another embodiment, introducing a gas-phase lubricant 131 having a high molecular weight (e.g., >100 amu) may also increase the ability of the monolayer 131A to act as a "buffer" or "bumper" between the mirror 102 and the landing pad 104A, further reducing the probability of stiction-related failures. The ability of the gas-phase lubricant to act as a "buffer" or "bumper" between the interacting surfaces may be due to the relatively large size of the gas molecules. The buffering property of the gas-phase lubricant may be present even in the absence of the formation of an adsorbed monolayer. In one aspect, the gas-phase lubricant may also form multiple adsorbed layers that supplement the lubrication/anti-stiction/anti-wear properties of the gas-phase lubricant or other added lubricating materials (e.g., self assembled monolayer (SAM) coatings). Referring to FIG. 2A, although the absorbed monolayer of gas-phase lubricant is illustrated as being formed on the landing electrode 104A, it is possible for an adsorbed monolayer to form alternately on the contract surface of the mirror 102, or on both the landing electrode 104A and the mirror 102. FIG. 3A illustrates the case where an adsorbed monolayer 131A of the gas-phase lubricant 131 has formed on the surface 105 of the base 103 and on all surfaces of the mirror 102, and thus is able to reduce the stiction forces by reducing the interaction of the mirror 102 and the landing electrode 104A. FIG. 3B is intended to illustrate a case where an adsorbed monolayer of the gas-phase lubricant is not formed, but the gas-phase lubricant 131 acts as a "buffer" (element 131B) between the mirror 102 and the landing electrode 104A, due to the presence of the gas-phase lubricant between the moving components.

In one embodiment, the surfaces on which the gas-phase lubricant adsorbs is tailored by the careful selection of materials from which the device components are formed or by performing surface modification steps, which either enhance or inhibit the interaction of the surface with the gas-phase lubricant. In one embodiment, the surfaces of the device (e.g., single mirror assembly 101) are modified by exposing them to microwaves, UV light, thermal energy, or other forms of electromagnetic radiation. In one aspect, all surfaces of the device are exposed to the one or more forms of electromagnetic radiation to modify the surface properties of the exposed surfaces. In another aspect, only defined regions of the device are exposed to the one or more forms of electromagnetic radiation to modify the surface properties of the exposed surfaces.

Figure 3C:
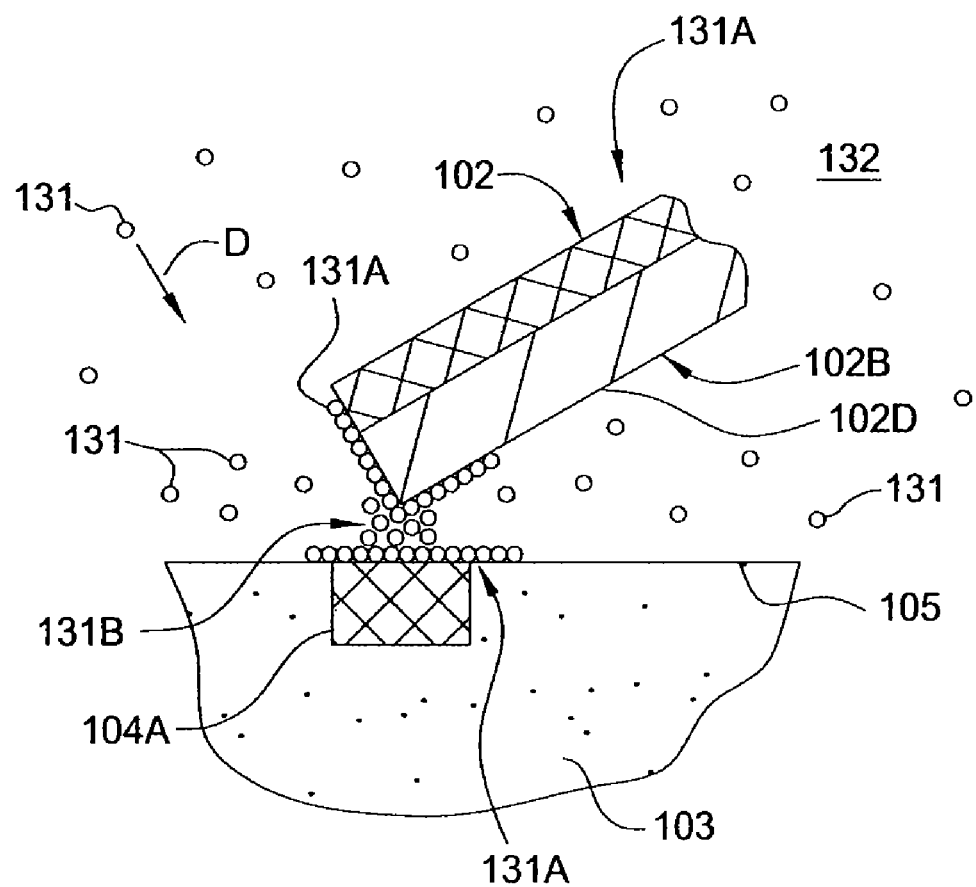
FIG. 3C illustrates a close-up cross-sectional view of a single mirror assembly 101, according to one embodiment of the invention.

In another embodiment, a "primer," or organic precursor material, may be selectively deposited on desired surfaces of the device to encourage the formation of a gas-phase lubricant monolayer at these locations. FIG. 3C illustrates the case where an adsorbed monolayer is preferentially formed on the landing electrode 104A, the mirror edge 102C, and part of the mirror base surface 102D. FIG. 3C also illustrates the case where the gas-phase lubricant also acts as a "buffer" (element 131B) between the surfaces that have an adsorbed monolayer 131A formed thereon, which may further help to reduce the interaction of the components, and thus reduce the chance of stiction type failure. The term "adsorbed monolayer" as used in herein is not intended to limit the scope of the invention described herein, since the mechanism by which gas-phase lubricant interacts with the moving components is very complex and is not intended to limit the scope of effect of adding a gas-phase lubricant in a region surrounding a device to reducing stiction type failures. Further, the term monolayer is intended to describe a layer that is a single molecule thick, as well as a layers that are many molecules in thickness.

In one embodiment, the gas-phase lubricant 131 is a gas at normal device operating temperatures. Typically, a device may be stored in areas where the temperature is between about −30° C. and about 70° C. and operate at a temperature that is within a standard operating temperature range, which is between about 0° C. and about 40° C. In one aspect, the gas-phase lubricant 131 is a gas, or is in a gaseous state, at temperatures preferably greater than about −30° C. In one aspect, the gas-phase lubricant 131 is disposed within a device that is adapted to operate at a temperature that is within an extended operating temperature range, which is between about 0° C. and about 70° C. In one aspect, the gas-phase lubricant 131 is selected so that it will not decompose at elevated temperatures, such as temperatures between about 300° C. and about 400° C., which are the temperatures that may be experienced during a typical MEMS or NEMS packaging process. Further, as a gas, the gas phase lubricant easily diffuses around and between components and thus generally does not require any special processing steps for the gas-phase lubricant to reliably cover the exposed surfaces to diminish stiction related problems. Further still, upon diffusion of the gas phase lubricant between opposing contact surfaces, the gas can immediately act as a buffer as described previously.

In general, an exemplary gas-phase lubricant has one or more of the following properties. First, an exemplary gas-phase lubricant has a high adsorption coefficient (i.e., large physisorption or chemisorption energy) so that the lubricant covers the exposed surfaces of the device, thereby reducing the direct interaction between contacting component surfaces during device operation. Second, an exemplary gas-phase lubricant has a low surface energy once disposed on the interacting component surfaces of a device, which reduces the stiction-related forces between the components when their surfaces are brought near each other during device operation. Third, an exemplary gas-phase lubricant has good lubrication properties to reduce friction forces between contacting surfaces. Fourth, an exemplary gas-phase lubricant has a low viscosity to reduce any retarding force that may adversely affect the dynamic motion of device components during operation. In one aspect, the gas-phase lubricant has a viscosity between about 10 micropoise and about 100 micropoise. Fifth, an exemplary gas-phase lubricant should not chemically attack or react with the materials from which the various components of the micromechanical device are made (e.g., silicon, aluminum, glass materials). Sixth, an exemplary gas-phase lubricant generally repels water (e.g., hydrophobic) to reduce the capillary-type stiction forces generated between the surfaces of interacting components. Seventh, an exemplary gas-phase lubricant exists in a gaseous state at standard temperature and pressure conditions. Eighth, an exemplary gas-phase lubricant exists in a gaseous state at standard temperature and a pressure above atmospheric pressure. Ninth, an exemplary gas-phase lubricant exists in a gaseous state at standard temperature and a pressure below atmospheric pressure. Tenth, an exemplary gas-phase lubricant exists in a gaseous state at the conditions under which it is introduced to the components to be lubricated. Eleventh, an exemplary gas-phase lubricant exists in a gaseous state under the operating conditions of the components to be lubricated. Twelfth, an exemplary gas-phase lubricant exists in a gaseous state when the components are in a non-standard operating condition (e.g., temperature or pressure is not in a desired range). Thirteenth, an exemplary gas-phase lubricant forms a monolayer on components at standard temperature and pressure. Fourteenth, an exemplary gas-phase lubricant forms a monolayer on components under the normal operating conditions. Fifteenth, an exemplary gas-phase lubricant forms a monolayer on components under non-standard operating conditions. Sixteenth, an exemplary gas-phase lubricant repairs a thin film layer on a component under normal operating conditions. Seventeenth, an exemplary gas-phase lubricant repairs a thin film layer on a component under non-standard operating conditions of the component. Other factors that may be considered when selecting an appropriate gas-phase lubricant are whether the lubricant is non-toxic and whether the lubricant has a low material cost. In another aspect, an exemplary gas-phase lubricant may also be non-polar, which tends to mitigate Van der Waal-type stiction forces formed between the surfaces of interacting components.

In configurations where the gas-phase lubricant is used in optical devices (e.g., digital spatial light modulators) an exemplary gas-phase lubricant may exhibit the following additional properties: (1) the gas-phase lubricant does not absorb the wavelengths of the incident or reflected optical radiation, (2) the gas-phase lubricant does not fluoresce due to the exposure to the incident optical radiation, and (3) the gas-phase lubricant does not breakdown due to the presence of the incident or reflected radiation (e.g., UV wavelengths).

In some configurations where the gas-phase lubricant is used in a micromechanical device an exemplary gas-phase lubricant may exhibit the following additional electrical properties: (1) the gas-phase lubricant does not ionize in an electric field up to about 300 Volts/µm, and (2) the gas-phase lubricant has good electrical insulating properties (e.g., high dielectric constant or permittivity). In one aspect, a gas-phase lubricant is selected that has a higher dielectric constant than typical gases used in conventional MEMS components, for example, nitrogen, air, argon, helium, or combinations thereof. The use of a gas-phase lubricant that has a higher dielectric constant can be beneficial since it can allow the circuit capacitance and maximum allowable applied bias $V_A$ to increase and, thus, allows the maximum restoring force $F_R$ to be increased. One will note that capacitance, $C = \varepsilon_o \varepsilon_r A/d$, where $\varepsilon_o$=permittivity of free space (constant), $\varepsilon_r$=dielectric constant of the gas-phase lubricant, A=area of electrodes and d=distance between electrodes. As previously described, by redesigning the flexible member 107 to increased restoring force $F_R$, the probability that stiction problems will arise will be reduced, since a larger stiction force would be required to cause device failure.

In various embodiments, a suitable gas-phase lubricant may be a haloalkane, sulfur hexafluoride ($SF_6$), silicon tetrafluoride ($SiF_4$), or various combinations thereof. Some haloalkanes that may be useful include perfluorocarbons ($C_xF_y$), such as perfluorocyclobutane (c-$C_4F_8$), hydrofluorocarbons ($H_xC_yF_z$) and chlorofluorocarbons (CFCs). Perfluorocyclobutane, also known as octafluorocyclobutane, and sulfur hexafluoride have many advantages since they can easily be purchased in a pure form and generally do not react with most materials. As previously mentioned, selecting a fluorinated gas-phase lubricant that has a molecular weight greater than about 100 amu may be desirable to ensure that it displaces typical atmospheric contaminants (e.g., air), it acts as a buffer between the surfaces of contacting components, and it can adsorb on the surfaces of the contacting components.

Generally, gas-phase lubricants have several advantages over conventional solid and liquid lubricants. These advantages include, but are not limited to, the following: (1) gas-phase lubricants diffuse at rates that are orders of magnitude higher than the rates at which conventional solid or liquid lubricants diffuse, which allows more rapid coverage of exposed surfaces created during the actuation of a micromechanical device, (2) gas-phase lubricants generally have a low viscosity, which reduces the possibility of the lubricant interfering with the dynamic motion of the moving components of a micromechanical device, (3) gas-phase lubricants are generally less expensive, and (4) gas-phase lubricants generally do not require additional, expensive processing steps to deposit and/or retain the lubricant materials within a micromechanical device. Also, in one aspect of the invention, since the gas-phase lubricant is disposed in the region 132B that surrounds the mirror 102, a ready supply of the lubricant is available to replenish "damaged," desorbed or broken down lubricant material, which may result during operation of the micromechanical devices.

FIG. 2B is a close-up illustration of the deflected single mirror assembly 101 of FIG. 1B that has been coated with a liquid or solid lubricant material 135. Also shown is the gas-phase lubricant 131 disposed in the region 132A between the interacting surfaces of the mirror 102 and the landing pad 104A. In this embodiment, the solid or liquid lubricant material 135 can be used to modify the surfaces of the mirror 102 and the landing pad 104A to reduce their respective surface energies, thereby further decreasing the likelihood of stiction-related failures. More specifically, adding the lubricant coating 135 may make the surfaces more hydrophobic, which reduces capillary-type stiction forces. Exemplary solid or liquid lubricants may include organic materials or other similar surface modifying component(s), such as self-assembled-monolayer (SAM) materials. As is well-known, SAMs generally include a single layer of molecules deposited on a substrate surface by simply adding a solution of the desired molecule onto the substrate surface and washing off the excess. Examples of useful SAM materials include, but are not limited to organosilane type compounds (e.g., octadecyltrichlorosilane (OTS), perfluorodecyltrichlorosilane (FDTS)).

The gas-phase lubricant 131 may be used to reduce degradation of the solid or liquid lubricant coating 135, such as a SAM layer, by reducing the amount of wear experienced by the lubricant coating 135 during operation. As a general matter, the lubricating properties of the gas-phase lubricant 131 and/or the adsorption of the gas-phase lubricant 131 on the surfaces coated with the solid or liquid lubricant tend to reduce the amount of wear experienced by the solid or liquid lubricant coating 135 during operation. Moreover, the gas-phase lubricant 131 also may act to "heal" regions of the lubricant coating 135 that are damaged during device operation. For example, when regions of the lubricant coating 135 are worn away by the continual contact or interaction of the moving device components, the high diffusion rate of the gas-phase lubricant 131 enables the gas-phase lubricant 131 to rapidly diffuse to those regions and replace the damaged portions of the lubricant coating 135.

Figure 4A:
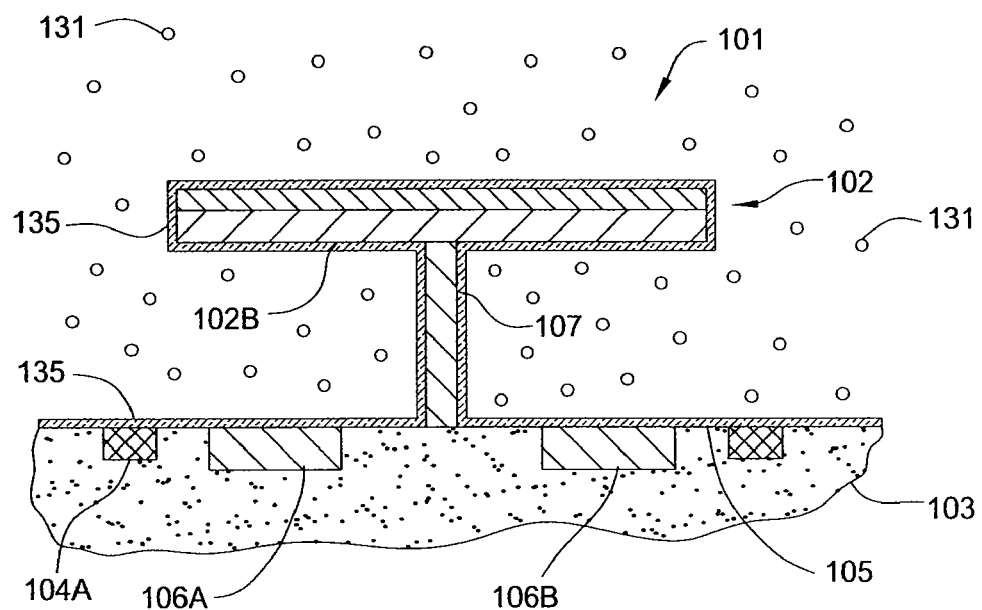
FIG. 4A schematically illustrates a cross-sectional view of a single mirror assembly 101 according to this invention.
Figure 4B:
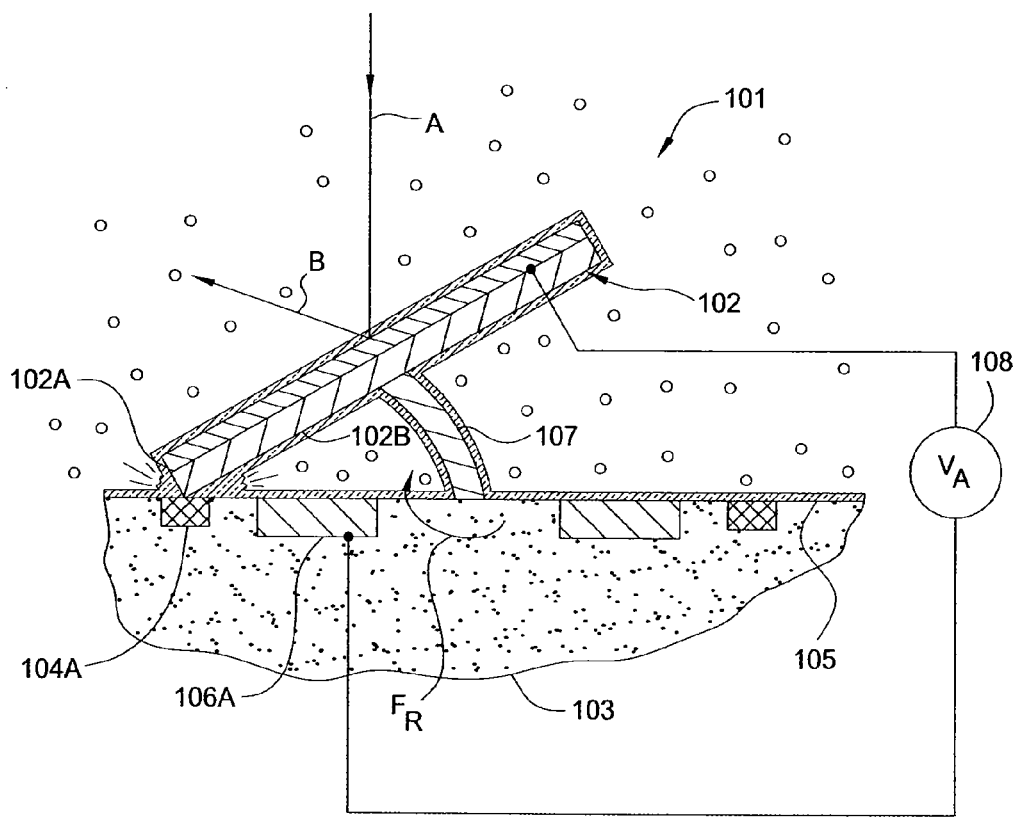
FIG. 4B schematically illustrates a cross-sectional view of a single mirror assembly 101 in a deflected state, according to one embodiment of the invention.
Figure 4C:
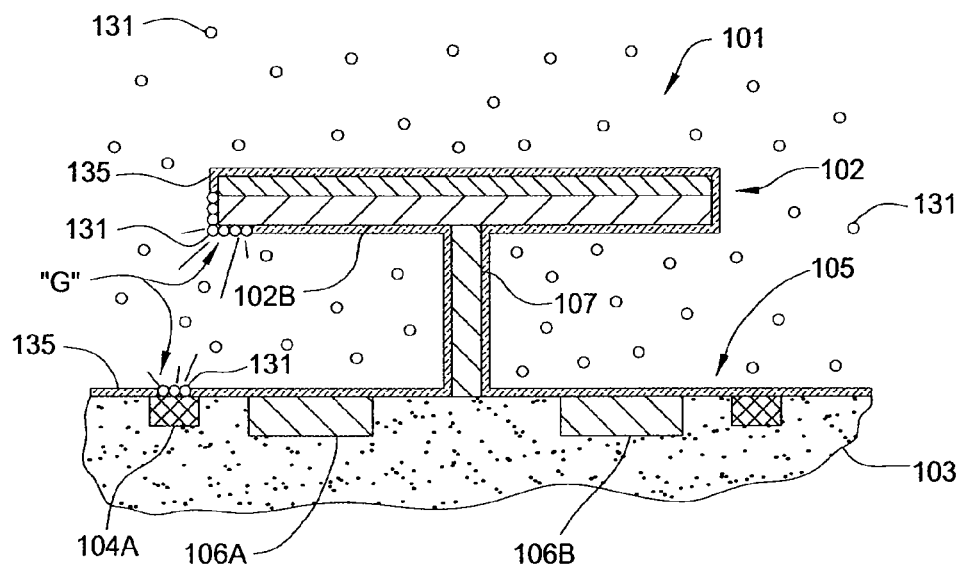
FIG. 4C schematically illustrates a cross-sectional view of a single mirror assembly 101 according to this invention.
Figure 4D:
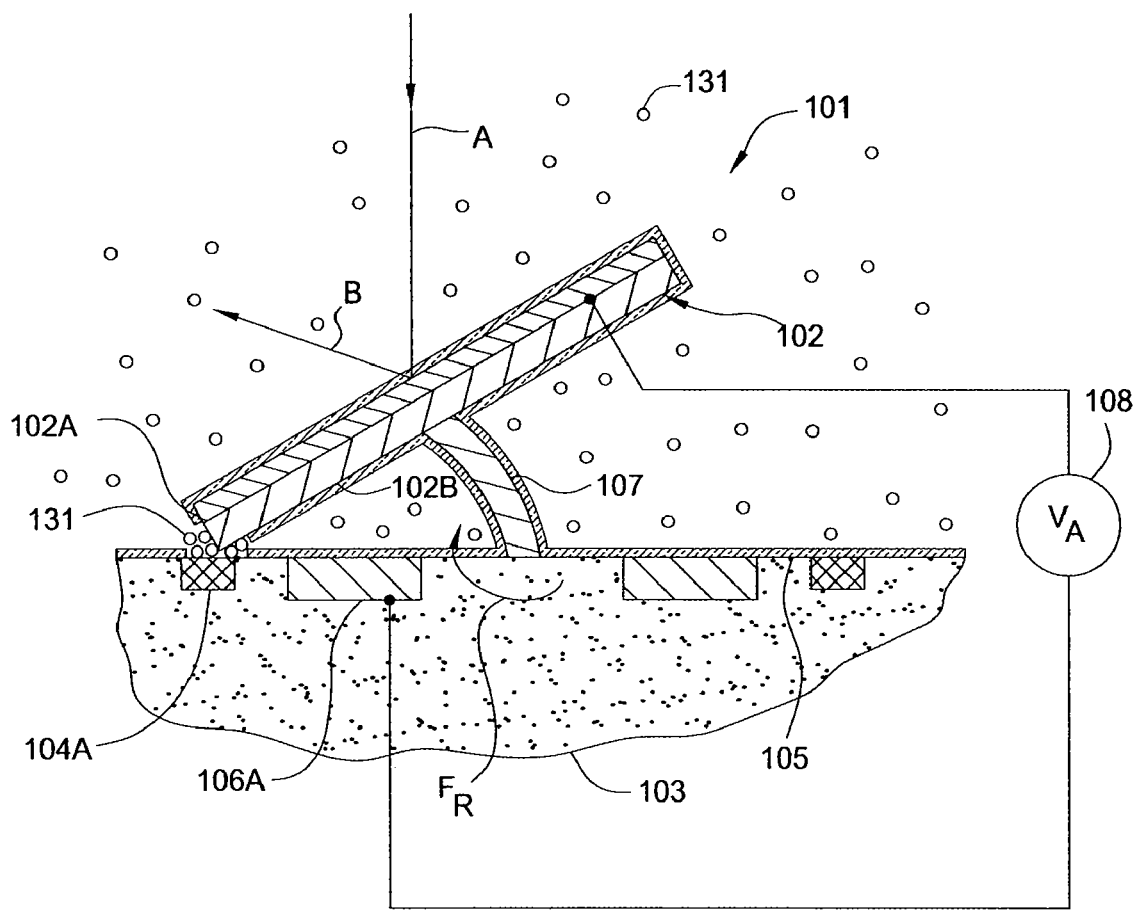
FIG. 4D schematically illustrates a cross-sectional view of a single mirror assembly 101 in a deflected state, according to one embodiment of the invention.

FIGS. 4A-4D are intended to schematically illustrate a cross-sectional view of a single MEMS device, such as a single mirror assembly 101, at different stages of its life. FIGS. 4A-4D are also intended to illustrate one example of how a damaged lubricant coating 135 can be "healed" by use of the gas-phase lubricant. FIG. 4A illustrates a cross-sectional view of a single mirror assembly 101 that has a continuous lubricant coating 135 deposited over the exposed surfaces. FIG. 4B is intended to illustrate how the lubricant coating 135 may become damaged due to the interaction of the various components (e.g., elements 102 and 104A). As shown in FIG. 4B, the lubricant coating 135 may become displaced or damaged due to the contact between the interacting surfaces, which can leave exposed regions (element "G" in FIG. 4C) of the underlying surfaces. FIG. 4C illustrates a cross-sectional view of a single mirror assembly 101 in its undeflected state that has a lubricant coating 135 coating that has become damaged and is "healed" due to the adsorption of the gas-phase lubricant in the exposed regions "G." FIG. 4D is intended to illustrate how the gas-phase lubricant can help reduce the interaction between the interacting surfaces that have a damaged lubricant coating 135 by the adsorption or buffering effect of the gas-phase lubricant in the exposed regions "G". The adsorption or buffering effect of the gas-phase lubricants can thus help increase the longevity of devices that have a lubricant coating 135 disposed over the interacting regions of the device.

In one embodiment, the components in the micromechanical device that contact one another during device operation may be processed using a conventional hexamethyldisilazane (HMDS) treatment process to form the lubricant coating 135 prior to disposing the gas-phase lubricant in the region surrounding the components. As is well-known, an HMDS process generally includes bringing a gas containing a vaporized HMDS material in contact with silicon containing component surfaces, causing a silylation process to occur on the component surfaces, which generally reduces the surface energies of the exposed component surfaces.

Figure 5A:
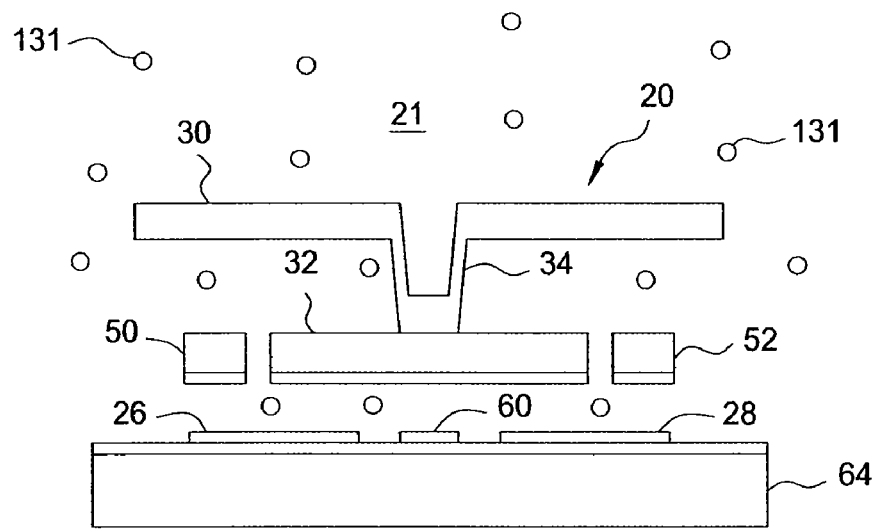
FIG. 5A schematically illustrates a cross-sectional view of an improved pixel device according to this invention.
Figure 5B:
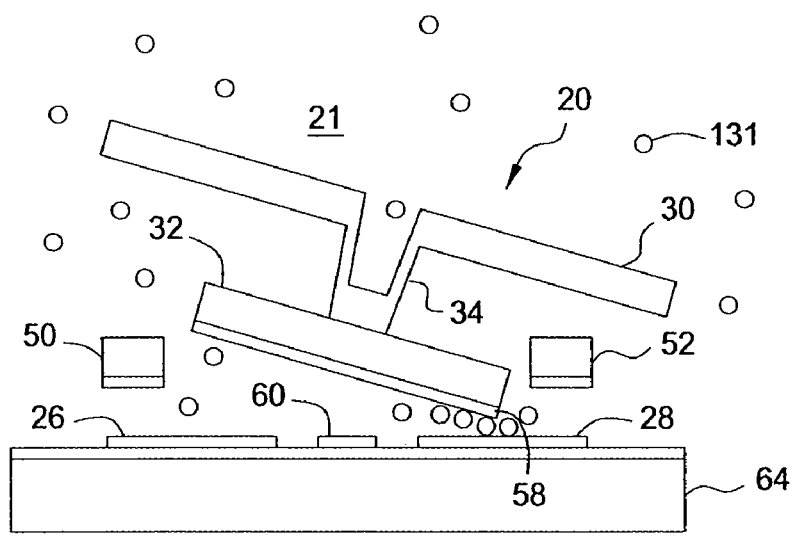
FIG. 5B schematically illustrates a cross-sectional view of an improved pixel device in a deflected state, according to one embodiment of the invention.

An example of other types of devices that may receive a benefit from the various embodiments of the invention described herein is shown in FIGS. 5A-5B. FIG. 5A illustrates a cross-sectional view of a single pixel 20 found in a digital micromirror device (DMD) spatial light modulator in its undeflected state that has a gas-phase lubricant 131 disposed within the region 21 that surrounds the pixel 20. Adding the gas-phase lubricant in this fashion reduces stiction problems. The pixel 20 may generally contain a mirror 30 (e.g., similar to element 102 in FIG. 1A), support posts 34, a yoke 32, mirror address electrodes 50 and 52, and address electrodes 26 and 28. FIG. 5B illustrates a cross-sectional view of the pixel 20 in its deflected state after a sufficient bias has been applied between the address electrode 28 and the yoke 32 and between the elevated electrode 52 and the mirror 30. In this configuration, the gas-phase lubricant 131 disposed around a pixel 20 reduces the chances that substantial stiction forces will arise between the yoke tip 58 and the address electrode 28 by reducing the interaction of these surfaces, as discussed above. A specific example of a single-pixel type device that may benefit from the teaching of the invention set forth herein is further described in U.S. Pat. No. 5,771,116, filed Oct. 21, 1996.

Figure 5C:
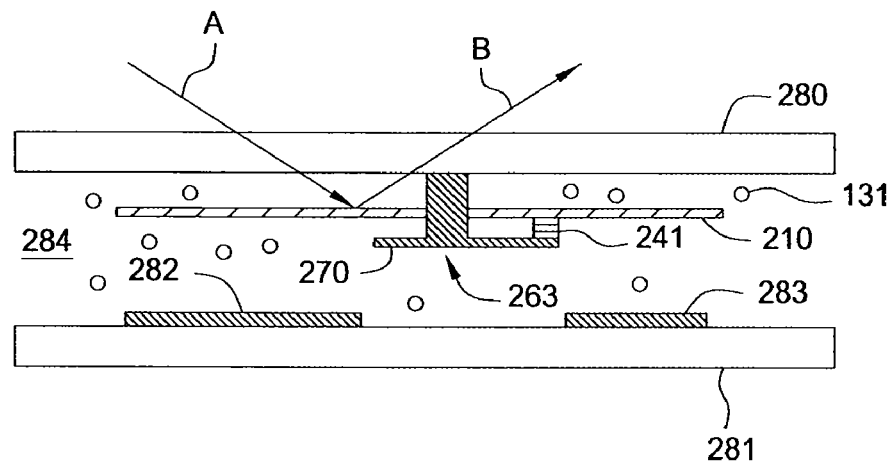
FIG. 5C schematically illustrates a cross-sectional view of an improved MEMS moveable mirror device according to this invention.
Figure 5D:
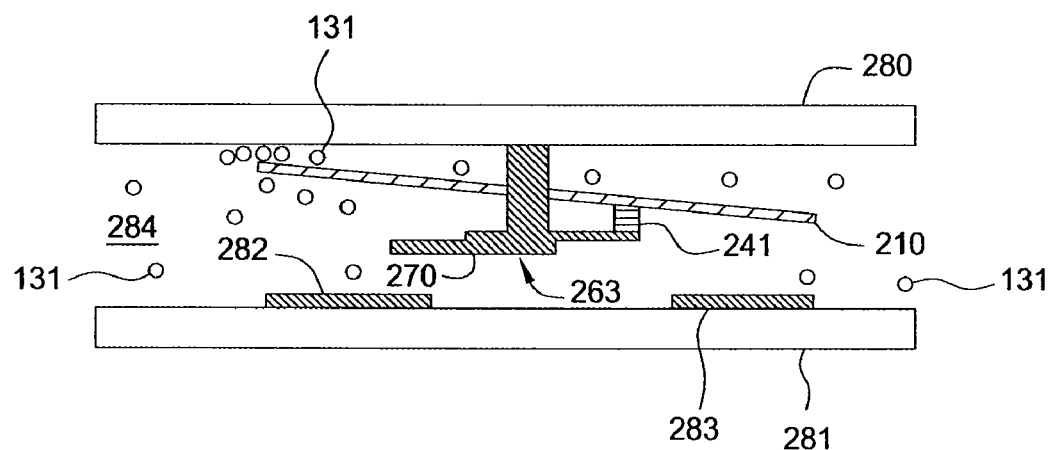
FIG. 5D schematically illustrates a cross-sectional view of an improved MEMS moveable mirror device in a deflected state, according to one embodiment of the invention.

Another example of a MEMS device that may benefit from the use of the gas-phase lubricant 131 is shown in FIGS. 5C-5D. This type of MEMS device is a moveable mirror device. FIG. 5C illustrates a cross-sectional view of a micromirror plate 210 that is in its undeflected state that has a gas-phase lubricant 131 disposed in the region 284 that surrounds the micro-mirror plate 210 (e.g., similar to element 102 in FIG. 1A). Again, adding the gas-phase lubricant 131 reduces stiction-related problems created when the micromirror plate 210 interacts with other surfaces. The MEMS moveable mirror device may generally contain the micromirror plate 210, electrodes 282 and 283, a hinge support 263, a shallow via contact 241 for providing a rotational axis, a wafer 281, and mirror stops 270. FIG. 5D illustrates a cross-sectional view of the micro-mirror plate 210 in its deflected state after a sufficient bias has been applied between the electrode 283 and the micro-mirror plate 210 by a power supply (not shown). In this configuration the gas-phase lubricant 131 disposed around the micro-mirror plate 210 reduces the chances that substantial stiction forces will arise between the micro-mirror plate 210 and the glass substrate 280 by reducing the interaction of the surfaces, as discussed above. A specific example of a moveable micro-mirror-type device that may benefit from the teaching of the invention set forth herein is further described in U.S. Pat. No. 6,960,305, filed Mar. 28, 2003.

Figure 6:
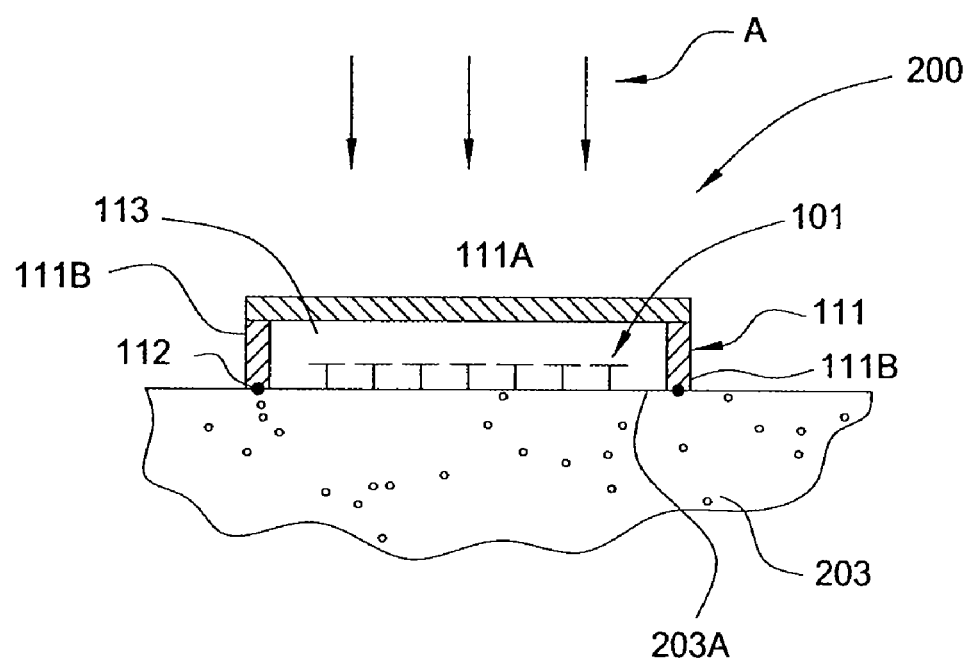
FIG. 6 illustrates a cross-sectional view of a device package assembly, according to one embodiment of the invention.

FIG. 6 illustrates a device package 200 containing an array of single mirror assemblies 101 positioned within a processing region 113 (or operating region), according to one embodiment of the invention. As shown, the processing region 113 is formed between a lid assembly 111 that is sealably coupled to a substrate 203 by use of a sealing member 112. The processing region 113 is filled with gas-phase lubricant that surrounds each of the individual mirror assemblies 101 disposed within the processing region 113. The processing region 113 may be filled with the gas-phase lubricant either prior to having the lid assembly 111 sealably coupled to the substrate 203, or may be filled via a fill line with access to the interior of the processing region 113. In one aspect, enough gas-phase lubricant is added to the processing region 113 so that the pressure within the processing region 113 is greater than atmospheric pressure. Such a configuration is useful since it reduces the likelihood that atmospheric contaminants will leak into the processing region 113 over the lifetime of the device. In one embodiment, the gas-phase lubricant is disposed within the processing region 113 when the lid assembly 111 is bonded and hermetically sealed to the substrate 203 during device fabrication. In another aspect, the gas-phase lubricant is added to the processing region 113 so that the pressure within the processing region 113 is less than atmospheric pressure.

In one aspect, the lid assembly 111 contains an optically transparent region 111A made of a display grade glass (e.g., Corning® Eagle 2000™) and a standoff element 111B made of a suitable material such as silicon. In general, the sealing member 112 can be an elastomeric element or a bonded region formed by bonding the lid assembly 111 to the substrate 203. Typical bonding processes include anodic bonding (e.g., electrolytic process), eutectic bonding, fusion bonding, covalent bonding, and/or glass frit fusion bonding processes. Examples of exemplary device packages 200 and processes of forming the device packages that may be used with one or more embodiments of the invention described herein are further described in the following commonly assigned U.S. patent application Ser. No. 10/693,323, filed Oct. 24, 2003, U.S. patent application Ser. No. 10/902,659, filed Jul. 28, 2004, and U.S. patent application Ser. No. 11/008,483, filed Dec. 8, 2004.

In one embodiment, the substrate 203 contains an array of MEMS that are formed on a surface 203A of the substrate 203. An example of a method of forming an array of MEMS devices on the substrate 203 is further described in the co-pending U.S. patent application Ser. No. 10/756,936, filed on Jan. 13, 2004. In another embodiment, the substrate 203 is formed from two major components that include, but are not limited to, a device substrate (element 352 in FIG. 7A) that includes the array of MEMS devices formed thereon, and a package base (element 350 in FIG. 7A). In such a configuration, the package base 350 is generally a separately machined component that is adapted to receive the device substrate 352 and be sealably connected to the lid assembly (element 351 in FIG. 7A) to form an enclosed processing region 113 around the array of MEMS devices formed on the device substrate 352.

Device Package Forming Processes

Figure 9:
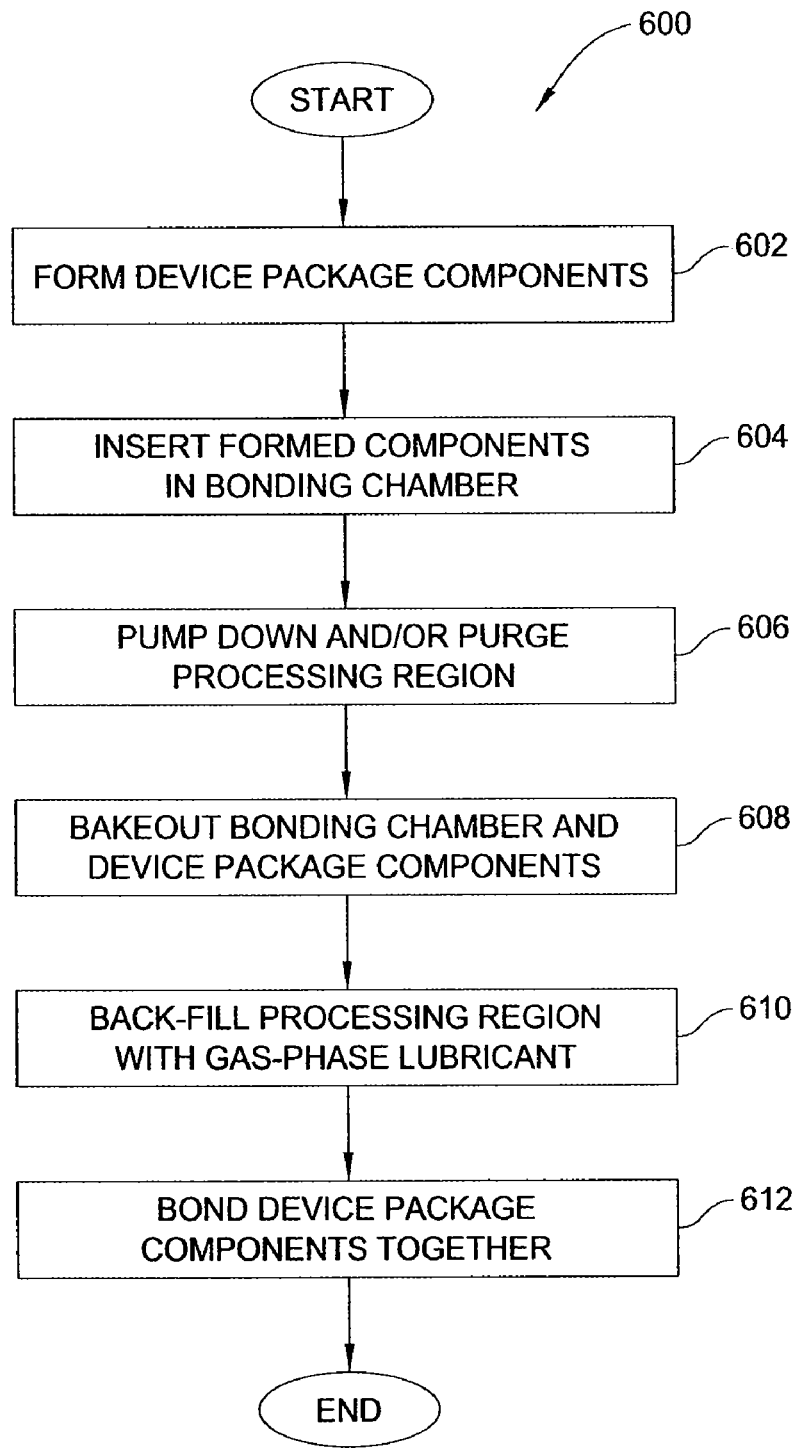
FIG. 9 illustrates a series of method steps for forming a device package assembly, according to one embodiment of the invention.
Figure 10:
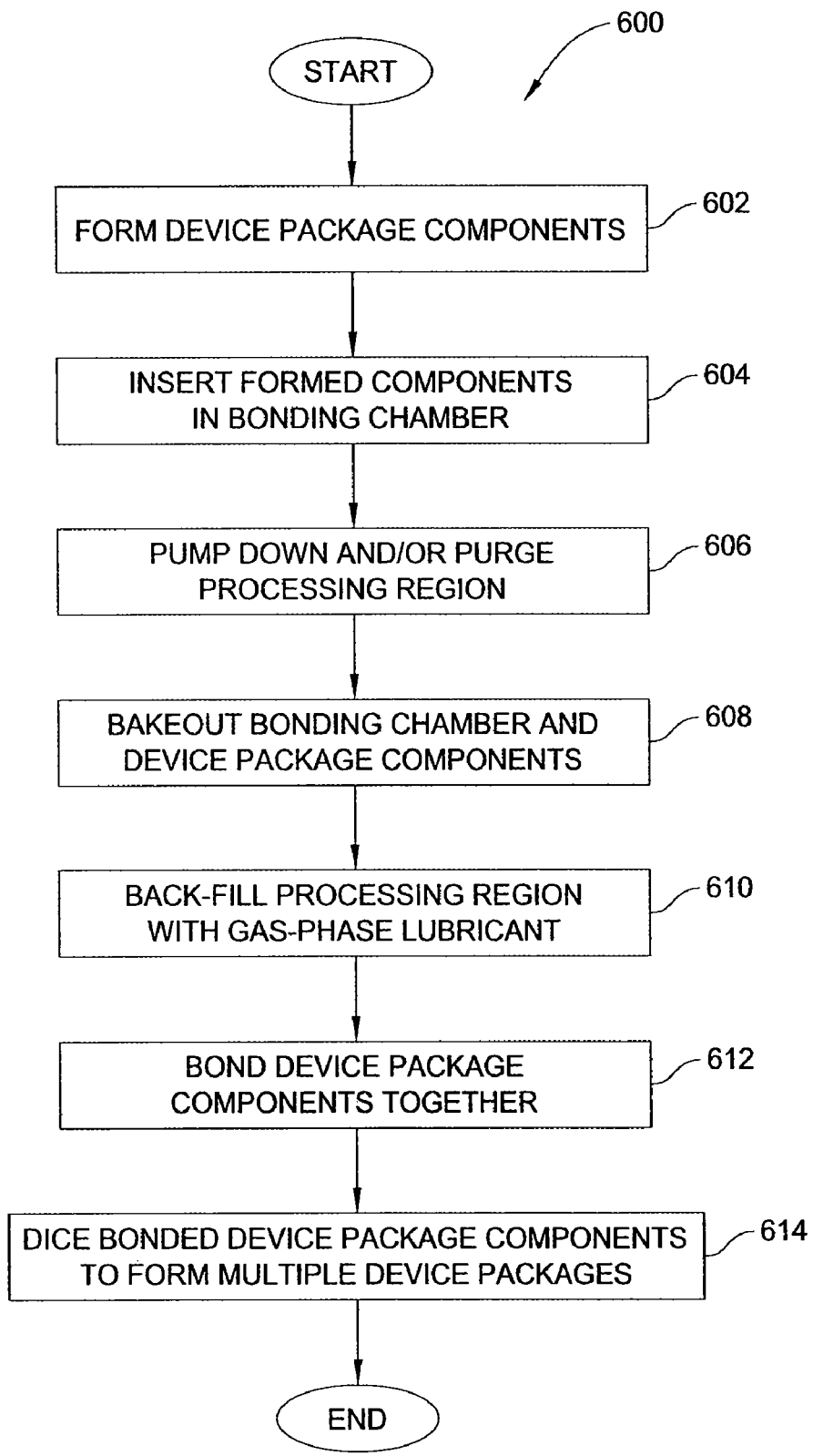
FIG. 10 illustrates a series of method steps for forming a device package assembly, according to one embodiment of the invention.

FIGS. 7A-7D and 8A-8E schematically illustrate the final stages of the process of forming an exemplary device package 200 that contains a gas-phase lubricant. More specifically, FIGS. 7A-7D illustrate a chip level device packaging process in which a gas phase lubricant is disposed in the processing region 113 of the formed device and FIGS. 8A-8D illustrate a wafer level device packaging process in which a gas phase lubricant is disposed in the processing region 113 of the formed devices. FIGS. 9 and 10 illustrate a packaging method 600 that has a series of method steps (e.g., elements 602-614) for forming the exemplary device package 200 that has a gas phase lubricant disposed within the processing region 113.

Figure 7A:
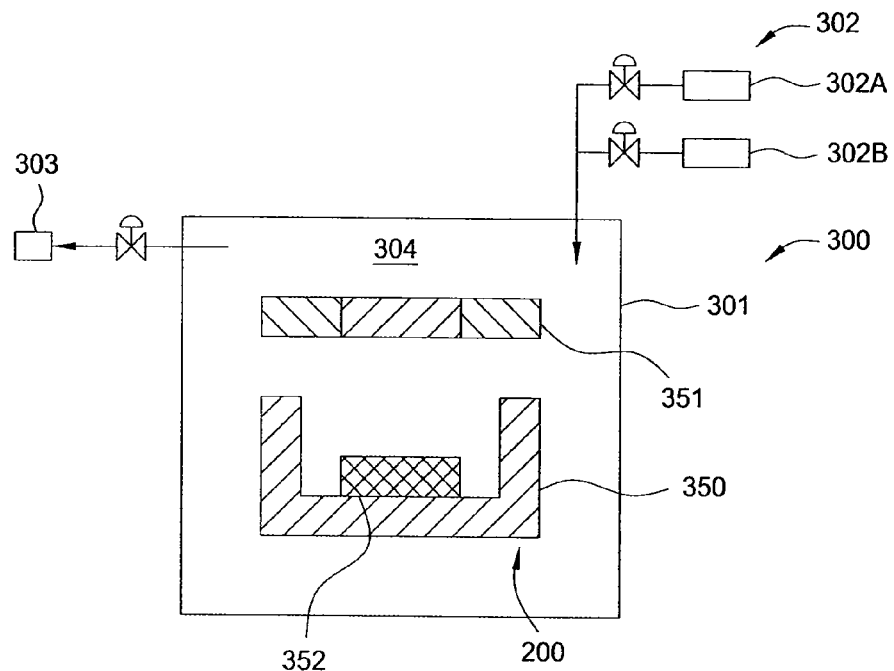
FIG. 7A illustrates a cross-sectional view of a device package assembly, according to one embodiment of the invention.

Each of the methods described in FIGS. 9 and 10 include a bonding process step to form a sealed processing region 113 around the micromechanical device(s). In one embodiment, the bonding process is performed in a bonding chamber assembly 300 (FIGS. 7A-7D and 8A-8D) that generally contains a bonding chamber 301, an exhaust system 303, a fluid delivery system 302, a heating device (not shown) and an actuator (not shown) that is adapted to position all of the device package 200 components so that the process of sealably bonding all of the major subassembly components together to form the device package 200 can be completed. In one aspect, the bonding chamber 301 is a conventional vacuum processing chamber that is adapted to form the device package 200 in a vacuum, atmospheric and/or elevated pressure environment. In one aspect, the exhaust system 303 contains one or more vacuum pumps that are adapted to pump down the chamber processing region 304 to a desired vacuum state during one or more of the processing steps. In one aspect, the exhaust system 303 is also be able to receive, reclaim and/or exhaust the various process gases injected into the chamber processing region 304. In one aspect, the fluid delivery system 302 contains a plurality of fluid sources that may be used during the packaging method 600. For example, as illustrated in FIG. 7A, the fluid delivery system 302 may contain a first fluid source 302A that is adapted to deliver a gas-phase lubricant and a second fluid source 302B that is adapted to deliver one or more components that are used to deposit a lubricant coating 135, such as a SAM layer.

Referring now to FIGS. 9 and 10, in step 602, all of the major subassemblies and components are formed so that the final packaging steps can be performed. Thus, step 602 occurs prior to the steps illustrated in FIGS. 7A and 8A (i.e., prior to the final steps of sealably forming the device package 200). The major subassemblies are generally formed using conventional manufacturing techniques up to the point where the step of bonding two or more components together, such as bonding the lid assembly 111 to the substrate 203, is the only process step before the processing region 113 is sealably formed around the MEMS device. Examples of various processing steps that may be completed to form the major subassemblies prior to forming the device package 200 are further described in the following commonly assigned U.S. patent application Ser. Nos. 10/693,323, 10/902,659, and 11/008,483. As set forth in these applications, some of the steps used to form the major subassemblies may include, but are not limited to, using one or more conventional semiconductor processing techniques to form the various MEMS devices, performing the machining and preparation steps to form the lid assembly 111, and forming one or more wire-bonding steps to connect the MEMS device to the various external leads.

Referring specifically to FIG. 9, in step 604, the various major subassemblies are positioned in the bonding chamber 301 of the bonding chamber assembly 300 so that the major subassemblies can be bonded together using conventional bonding techniques, as described below in step 612, to form the device package 200. Referring to FIG. 7A, in one embodiment, the major device package 200 assemblies consist of two major components: a lid assembly 351 (e.g., similar to element 111 discussed above) and a package base 350 that has a device substrate 352 mounted in it. In this configuration, each of the major components is positioned in the chamber processing region 304 of the bonding chamber 301 so that the element is in contact, or communication, with the processing region 304. In general, the device substrate 352 has one or more micromechanical devices formed on it by use of conventional manufacturing techniques.

In step 606, the bonding chamber 301 is pumped down to a vacuum state and/or the bonding chamber 301 is purged with clean and dry gas. In one aspect, the bonding chamber is pumped down to a pressure between about $10^{-6}$ Torr and about $10^{-3}$ Torr and maintained at this pressure for a desired period of time to assure that the device package 200 has been completely outgassed and thus is free of any residual water or other contaminants. In another aspect, the bonding chamber 301 is maintained at a pressure near atmospheric pressure while a flow of a high-purity, clean and dry gas is delivered from the fluid delivery system 302 to the exhaust system 303. The flow of a high-purity, clean and dry gas through the chamber processing region 304 reduces the partial pressure of water and other contaminants in the bonding chamber 301. Typical high-purity, clean and dry gases may include, but are not limited to, inert gases such as argon (Ar), Nitrogen ($N_2$), and helium (He). These types of gases can be purchased in an electronic or VLSI grade that has a purity level of at least $\geq 99.999\%$. In yet another aspect, a one or more pump down and then backfill with a high-purity, clean and dry gas steps are performed to more rapidly reduce the time required to remove the unwanted contaminants (e.g., water) from the device package 200 components and the bonding chamber 301.

In step 608, an optional bakeout out step is performed by heating the bonding chamber 301 and device package 200 components to an elevated temperature, while the bonding chamber 301 is maintained at a vacuum pressure (<760 Torr) or in an environment of a clean and dry gas to further remove any contaminants from the chamber processing region 304. In one aspect, the bonding chamber 301 and device package 200 components are heated to a temperature of about 150° C. for a period of time between about 30 and about 100 minutes to assure the removal of any unwanted contaminants. In one example, the temperature of the bonding chamber 301 and device package 200 components are slowly increased to the bakeout temperature at a rate of about 15° C./minute. The bonding chamber 301 and device package 200 components may be heated by use of conventional radiant heat lamps (not shown), conventional resistive heaters (not shown) or other similar devices positioned in the chamber processing region 304 or mounted on the external walls of the bonding chamber 301.

Figure 7B:
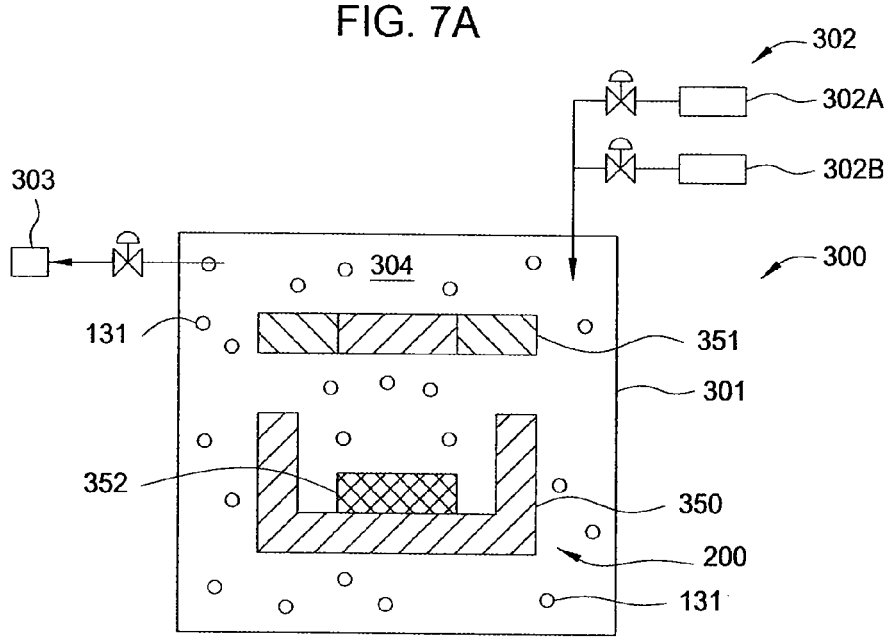
FIG. 7B illustrates a cross-sectional view of a device package assembly, according to one embodiment of the invention.
Figure 7C:
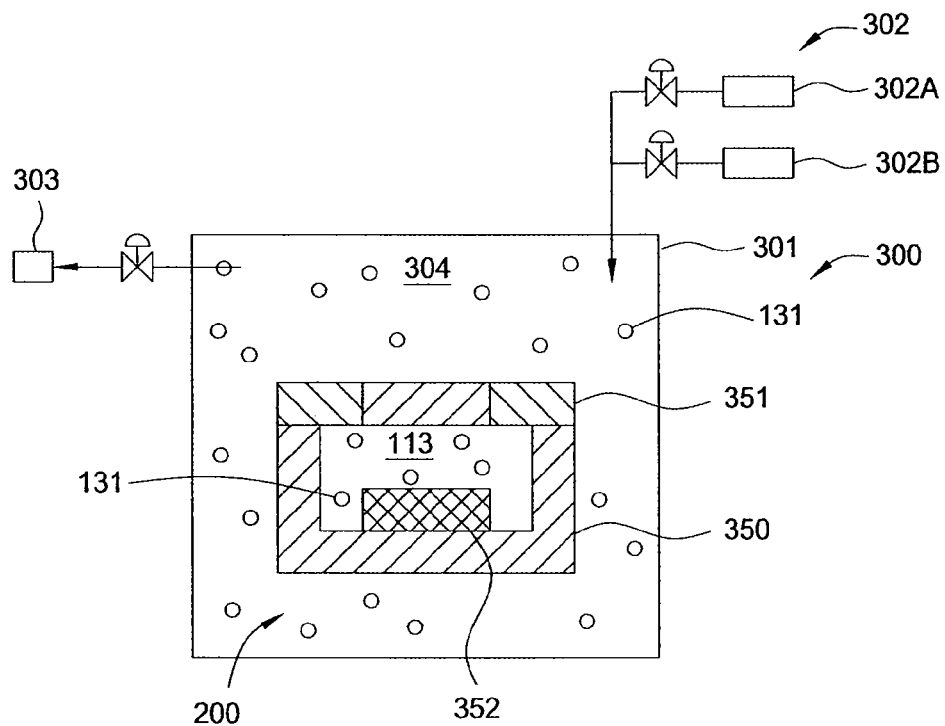
FIG. 7C illustrates a cross-sectional view of a device package assembly, according to one embodiment of the invention.
Figure 7D:
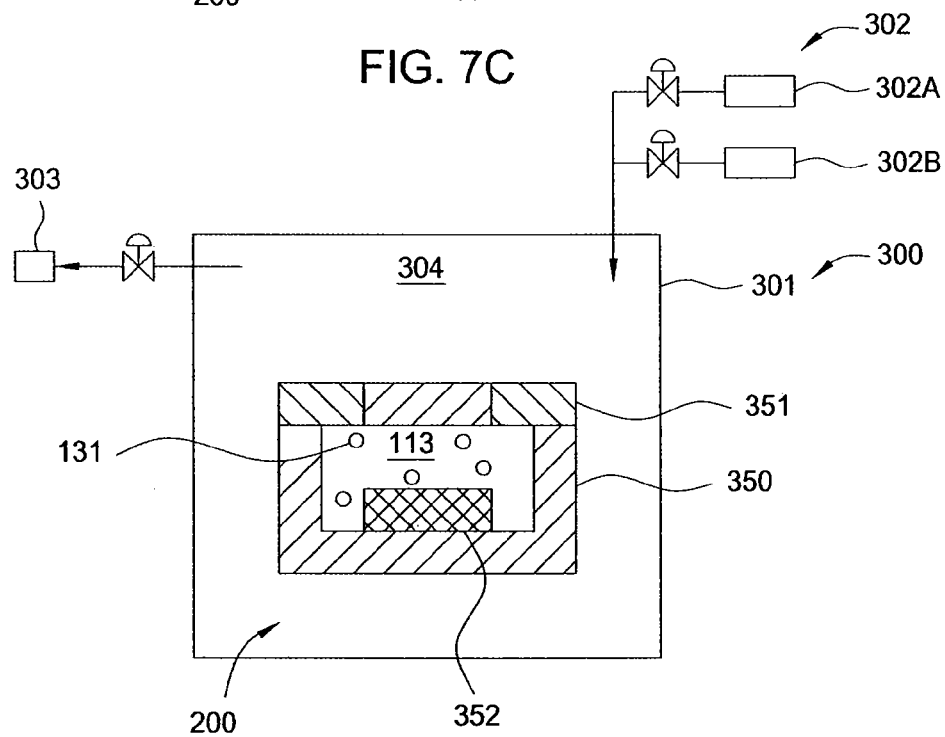
FIG. 7D illustrates a cross-sectional view of a device package assembly, according to one embodiment of the invention.

In step 610, the gas-phase lubricant is backfilled into the chamber processing region 304 until a desired pressure is achieved. In one aspect, the gas-phase lubricant is added until the pressure in the chamber processing region 304 is in a range between about 700 Torr and about 800 Torr. Referring to FIG. 7B, the gas-phase lubricant 131 is delivered to the chamber processing region 304 from the first fluid source 302A until the desired pressure is achieved. In one aspect of the packaging method 600, prior to performing step 610, pumping the chamber processing region 304 to a high vacuum state (e.g., $10^{-5}$ Torr) to further assure that any residual gases and contaminants are removed. In one embodiment, the deposition of the lubricant coating 135 is completed prior to performing step 610.

Referring again to FIG. 7C, in step 612, the lid assembly 351 is bonded to the package base 350 so that the device substrate 352 and gas-phase lubricant are trapped in the formed processing region 113 of the device package 200. Typical bonding processes may include anodic bonding (e.g., electrolytic process), eutectic bonding, fusion bonding, covalent bonding, and/or glass frit fusion bonding processes. After the lid assembly 351 is bonded to the package base 350, the gas-phase lubricant 131 can be removed from the chamber processing region 304 (e.g., FIG. 7D), bonding chamber 301 can be vented, and then the device package 200 can be removed from the bonding chamber 301 so that any further processing steps that are needed to form a fully functional device may be performed on the device package 200.

One should note that gas-phase lubricants generally do not need to be "activated" during the device package forming processes. By contrast, the activation process is usually necessary when forming a device that uses conventional solid and liquid phase lubricants. Typically, activation processes require the use of high temperature (e.g., 300 to 400° C.) activation steps to cause the solid or liquid lubricant(s) to bond to desired components and become an effective lubricant. The temperatures used to perform the activation process (es) are usually equivalent to the highest temperatures that the device package components experience during the device packaging process. Again, in sharp contrast, the gas-phase lubricant does not require these activation steps and thus allows the flexibility of using lower temperature sealing materials and processes, which may make the device packages 200 less expensive and easier to manufacture. Moreover, in one aspect, due to the anti-stiction and anti-wear properties of the gas-phase lubricant the activation process steps are not used and thus the device packaging process can be performed at temperatures less than about 250° C.

Wafer Level Packaging

Figure 8A:
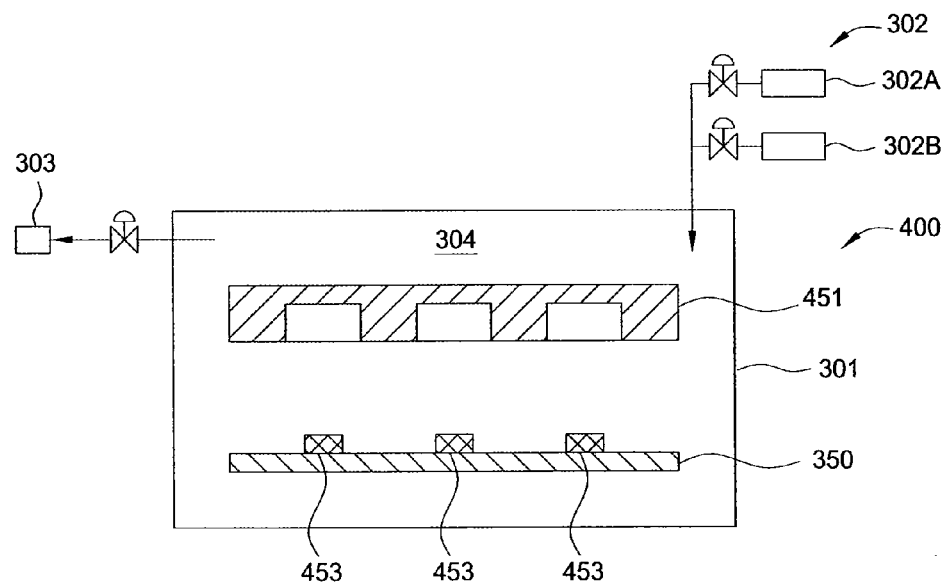
FIG. 8A illustrates a cross-sectional view of a device package assembly, according to one embodiment of the invention.
Figure 8B:
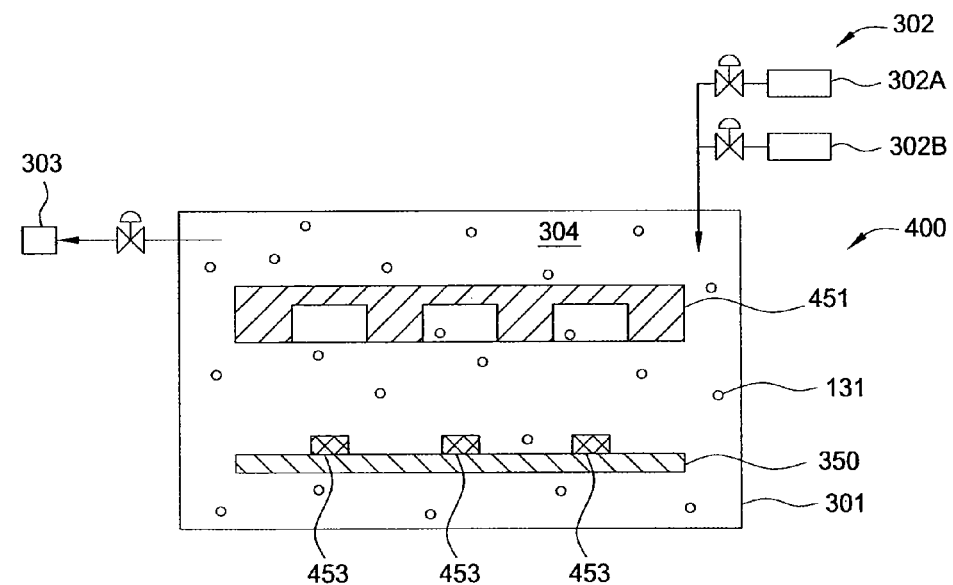
FIG. 8B illustrates a cross-sectional view of a device package assembly, according to one embodiment of the invention.
Figure 8C:
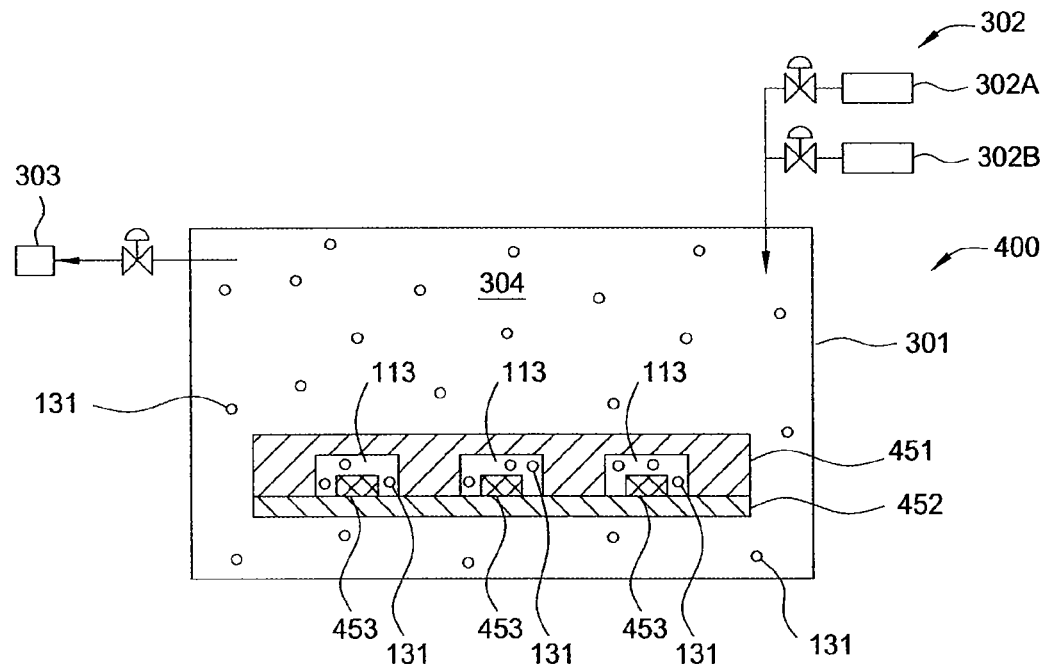
FIG. 8C illustrates a cross-sectional view of a device package assembly, according to one embodiment of the invention.
Figure 8D:
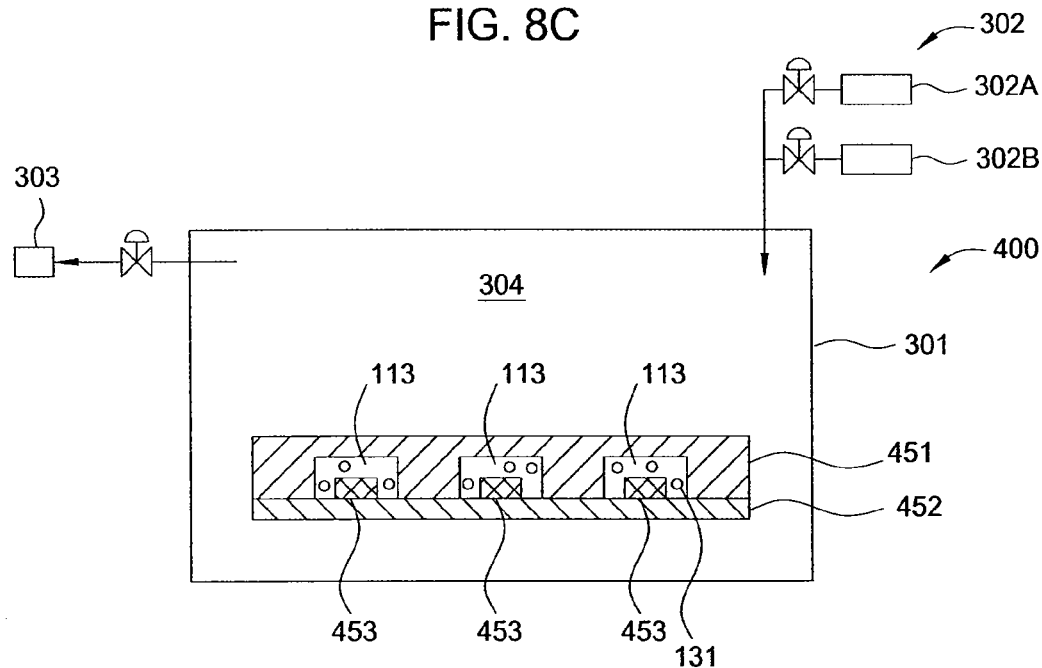
FIG. 8D illustrates a cross-sectional view of a device package assembly, according to one embodiment of the invention.
Figure 8E:
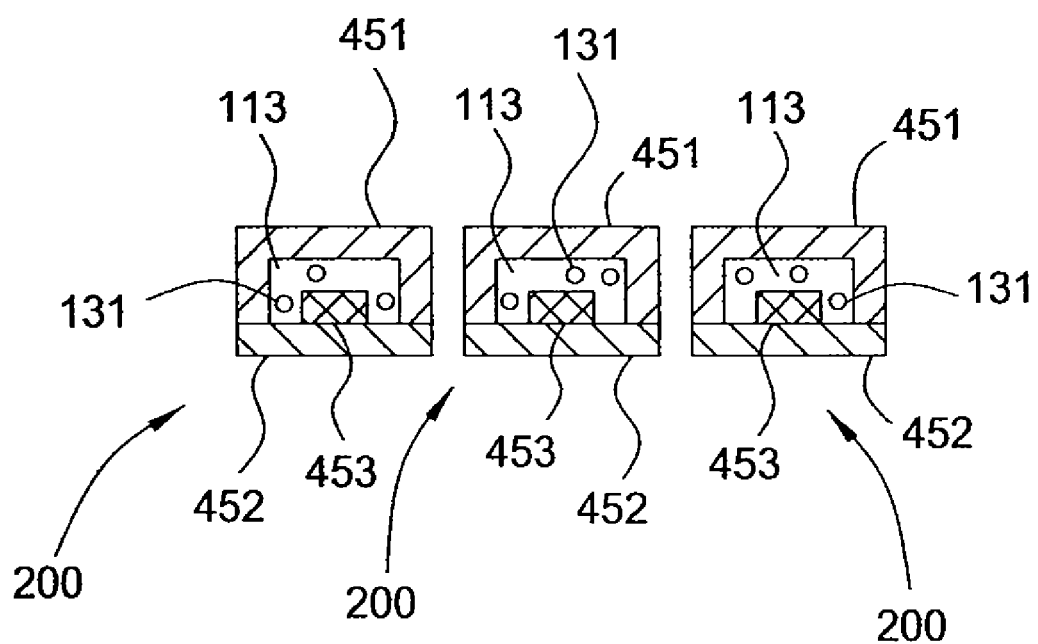
FIG. 8E illustrates a cross-sectional view of a device package assembly, according to one embodiment of the invention.

FIGS. 8A-8D illustrate a wafer level device packaging process in which a gas phase lubricant is disposed in the processing region 113 of the formed devices following the steps described in FIG. 10. The method steps 602 through 612 are generally the same as described above in conjunction with FIG. 9 except a wafer level packaging process is used to eventually form multiple device packages 200 (FIG. 8E). Referring to FIGS. 8A and 10, in step 602, all of the major subassemblies (e.g., elements 451 and 452) are formed so that the final packaging steps can be performed. The major subassemblies are generally formed using conventional manufacturing techniques to the point where the step of bonding two or more components together is the only process step left to perform before the processing region 113 is sealably formed around the MEMS devices. As noted above, an example of various processing steps that may be completed to form the major subassemblies prior to forming the device package 200 are further described in the following commonly assigned U.S. patent application Ser. Nos. 10/693,323, 10/902,659, and 11/008,483.

In step 604, the various major subassemblies are positioned in the bonding chamber 301 of the bonding chamber assembly 300 so that the major device package 200 assemblies can be brought into contact and bonded together using conventional bonding techniques. Referring to FIG. 8A, the major device package 200 assemblies generally consist of two major components: a lid assembly 451 (e.g., similar to element 111 discussed above) and a substrate 452 that has a plurality of MEMS arrays 453 formed on it. In this configuration, each of the major components are positioned in the chamber processing region 304 of the bonding chamber 301 so that the each element is in contact, or communication, with the processing region 304. In general, the MEMS arrays 453 formed on the substrate 452 generally contain a plurality of micromechanical devices that are formed by use of conventional semiconductor manufacturing techniques.

In step 606, the bonding chamber 301 is pumped down to a vacuum state and/or the bonding chamber 301 is purged with clean and dry gas, as described above. In step 608, an optional bakeout out step is performed by heating the bonding chamber 301 and device package 200 components to an elevated temperature while the chamber processing region is maintained at a vacuum pressure (<760 Torr) or at a pressure near atmospheric pressure that has a low partial pressure of contaminants (e.g., water), as described above. In step 610, the gas-phase lubricant is backfilled into the chamber processing region 304 until a desired pressure is achieved, as described above. In one embodiment, the deposition of the lubricant coating 135 is completed prior to performing step 610.

In step 612, referring again to FIG. 8C, the lid assembly 451 is bonded to the substrate 452 so that the gas-phase lubricant is trapped in the formed processing regions 113 around each of the MEMS arrays 453 in each of the device packages 200. Typical bonding processes may include anodic bonding (e.g., electrolytic process), eutectic bonding, fusion bonding, covalent bonding, and/or glass frit fusion bonding processes. After the lid assembly 451 is bonded to the substrate 452, the gas-phase lubricant 131 can be removed from the chamber processing region 304 (e.g., FIG. 8D), bonding chamber 301 can be vented, and then the device package 200 can be removed from the bonding chamber 301.

In step 614, the bonded lid assembly 451 and substrate 452 are then cleaved, sawed or diced to form multiple device packages 200 so that any further processing steps that need to be completed to form a fully functional device may be performed on the device package 200. In one embodiment, the individual dies are separated (e.g., cleaved, sawed or diced) by cutting the substrate into dies using a diamond saw. In an alternative embodiment, the dies are separated by scribing the substrate 451 using a diamond scribe. In an embodiment of the invention in which the substrate is a silicon wafer, the die separation is performed by sawing the silicon substrate with a rotating circular abrasive saw blade. As shown in FIGS. 8A-8E three device packages 200 are formed so that the gas-phase lubricant (element 131) is positioned in the processing region 113 to reduce stiction type failures.

Figure 11A:
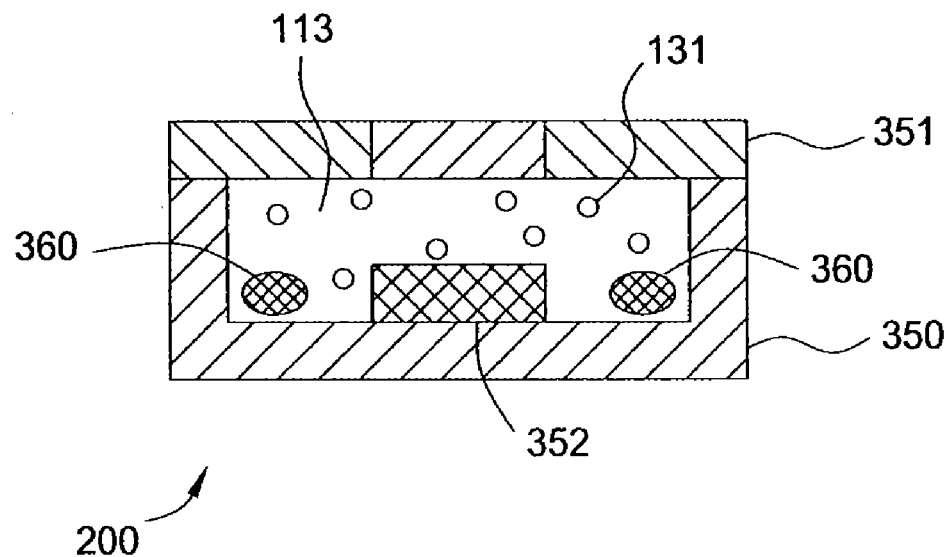
FIG. 11A illustrates a cross-sectional view of a device package assembly, according to one embodiment of the invention.

FIG. 11A is cross-sectional view of device package that has getters 360 and a gas-phase lubricant 131 positioned in the processing region 113 of the device package 200. In this configuration the formed device may benefit from the use of a solid or liquid lubricant that is retained and slowly leached from the getters 360 and also the rapid "healing" and/or buffering effect of the gas-phase lubricant. As noted above getters are generally used to trap any moisture found in the processing region 113 and also slowly release the liquid lubricant. However, by following the processes described above in FIGS. 9 and 10 to form a device package 200 and/or the fact that most of the exemplary gas-phase lubricants discussed above can be delivered in a pure or "dry" form, the need for the moisture trapping function of the getter materials is generally not needed. Further, since the gas-phase lubricant can placed in the processing region 113 of the device package at a pressure greater than atmospheric pressure the chance of atmospheric contamination from entering the processing region 113 from the outside of the device package is greatly reduced, which also reduces the need for the getters 360.

Figure 11B:
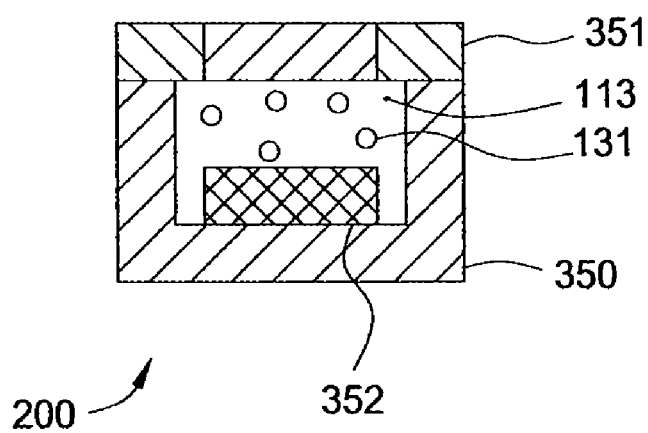
FIG. 11B illustrates a cross-sectional view of a device package assembly, according to one embodiment of the invention.

Moreover, since the exemplary gas-phase lubricants are effective in reducing stiction related problems the liquid lubricants are un-necessary. Therefore, in one aspect of the invention, a device package 200 containing only gas-phase lubricants is used with no getters 360 and no liquid lubricants. One advantage of removing the need for the often expensive getters 360 is the fact that the size of the device package can be much smaller than conventional device packages that contain getters. FIG. 11B illustrates a cross-sectional view of a device package 200 that contains only a gas-phase lubricant 131. Since the space in the processing region 113 that was taken up by the getters 360 is not needed the device package can be made much smaller in size than conventional device packages (see FIG. 11A). The reduction in the device package size will reduce the manufacturing and piece part costs, thus making the device package forming process much more cost effective and competitive.

Figure 12:
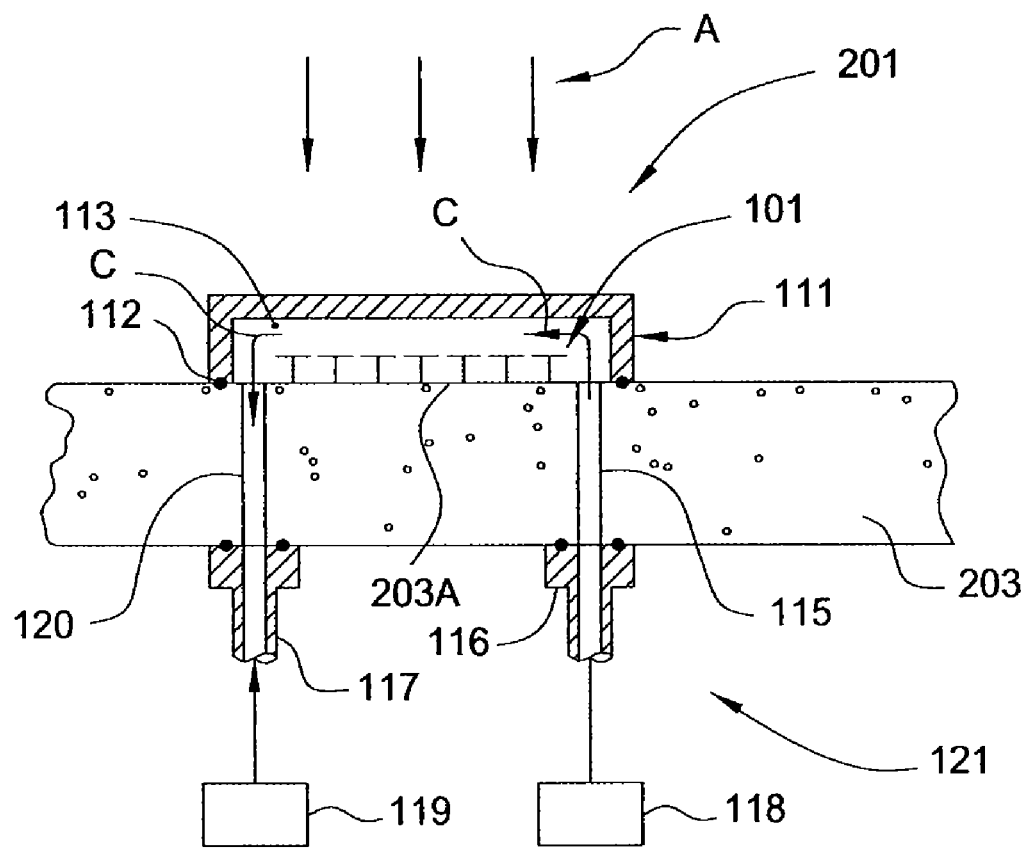
FIG. 12 illustrates a cross-sectional view of a device package assembly, according to another embodiment of the invention.

FIG. 12 illustrates a device package 201 that contains an array of single mirror assemblies 101 and gas-phase lubricant source assembly 121 that is coupled to the processing region 113, according to one embodiment of the invention. The gas-phase lubricant source assembly 121 generally includes a gas-phase lubricant source 118 and a gas-phase lubricant collection device 119 that are fluidly coupled to the processing region 113 so that a flow of the gas-phase lubricant (element "C") can be continuously or intermittently delivered to the processing region 113 as desired. As shown, the gas-phase lubricant is delivered from the gas-phase lubricant source 118 through an inlet tube 116 that is sealably connected to the substrate 203, through an inlet gas port 115 formed in the substrate 203, into and through the processing region 113, out the exit gas port 120 formed in the substrate 203, through the outlet tube 117 that is sealably connected to the substrate 203, and into the gas-phase lubricant collection device 119. The gas-phase collection device 119 may be simple vessel adapted to collect the gas-phase lubricant, or the collection device 119 may be a conventional exhaust or recycling system.

Experiments have shown that the gas-phase lubricant may be injected into the processing region 113 of the device package 201 to release device components that have become inoperable due to stiction-type forces generated during device operation. In one aspect, the gas-phase lubricant may be injected into the processing region 113 until a desired concentration of gas-phase lubricant has been achieved. In another aspect, a flow of gas-phase lubricant may be delivered through the processing region 113 for a set period of time or until the device components become operable once again. In either case, introducing the gas-phase phase lubricant appears to reduce the stiction forces $F_s$ between device components enough to allow the restoring force $F_R$ to return the moving component (e.g., the mirror assembly 101 of FIG. 1B) to its un-actuated positions. In another embodiment, a process may be employed which allows one or more devices that have failed due to stiction to become usable again by allowing the inoperable components to remain idle in the gas-phase lubricant for a period of time. In this scenario, the gas-phase lubricant already present within the processing region 113 is allowed to interact with the inoperable components to lower the stiction forces $F_s$ enough to allow the restoring forces $F_R$ to move the components back to their un-actuated positions.

The use of the gas-phase lubricant has many benefits when compared to liquid lubricant containing devices, which include reduced material cost, reduced manufacturing cost, reduced device complexity, and an increased ability to rapidly "heal" exposed regions between interacting components, to name just few benefits. Another benefit of using a gas-phase lubricant is due to its ability to help release inoperable components while they are still in use. Various processing steps can be used to release inoperable components using conventional liquid lubricants, but these processing steps require that the affected device be taken out of service so that the device can be immersed in the liquid lubricant. These added steps to help release inoperable components when using liquid or solid lubricants is wasteful, time consuming and costly, due to the down time of the system using the failed component and the added processing steps. Further, liquid lubricants can leave a residue that will foul the device.

In one embodiment, the gas-phase lubricant may be delivered to the processing region 113 only when the MEMS or NEMS device is operational (i.e., component parts are moving) to reduce the overall amount of gas-phase lubricant used. In another aspect, the gas-phase lubricant may be delivered to the processing region 113 at a predefined interval during device operation to regularly replenish or refresh the gas-phase lubricant in the processing region 113.

The systems and techniques disclosed herein advantageously use a gas-phased lubricant to lubricate, reduce stiction-related forces, and/or provide anti-wear protection between contacting surfaces of micromechanical devices, such as MEMS devices, NEMS devices. Among other things, gas-phase lubricants diffuse at rates that are orders of magnitude higher than the diffusion rates of conventional solid or liquid lubricants diffuse. A higher diffusion rate enables a gas-phase lubricant to be self-replenishing, meaning that gas-phase lubricants can quickly move back into a contact region after being physically displaced from the region by the contacting surfaces of the micromechanical device during operation. Consequently, gas-phase lubricants are more reliable than conventional solid or liquid lubricants in preventing stiction-related device failures. Further, gas-phase lubricants and ways to replenish these lubricants may be included in device package designs without introducing costly fabrication steps or substantially increasing overall design complexity. Thus, gas-phase lubricants provide a reliable, cost-effective way to reduce stiction-related forces in MEMS or NEMS devices relative to conventional solid or liquid lubricants.

While the foregoing is directed to embodiments of the present invention, other and further embodiments of the invention may be devised without departing from the basic scope thereof, and the scope thereof is determined by the claims that follow.

The invention claimed is:

1. A method of operating a micromechanical device comprising:
   biasing one or more electrodes, wherein biasing the one or more electrodes causes a moveable component having a first contact surface to interact with a second contact surface;
   biasing the one or more electrodes repeatedly until a stiction force prevents the first contact surface from being separated from the second contact surface; and
   separating the first contact surface from the second contact surface by exposing the first and second contact surfaces to a gas-phase lubricant.

2. The method of claim 1, wherein the gas-phase lubricant is a gas containing a haloalkane.

3. The method of claim 1, wherein the gas-phase lubricant is selected from a group consisting of sulfur hexafluoride, silicon tetrafluoride and perfluorocyclobutane.

4. The method of claim 1, wherein the gas-phase lubricant is a fluorinated compound that has a molecular weight greater than about 100 amu.

5. The method of claim 1, wherein the moveable component comprises a mirror.

6. The method of claim 1, wherein the micromechanical device is an optical image processor or a spatial light modulator.

* * * * *